United States Patent
Rasmus

(10) Patent No.: US 11,374,560 B1
(45) Date of Patent: Jun. 28, 2022

(54) DYNAMIC CROSS-COUPLED REGENERATION FOR HIGH-SPEED SENSE AMPLIFIER

(71) Applicant: QUALCOMM Incorporated, San Diego, CA (US)

(72) Inventor: Todd Morgan Rasmus, Cary, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/321,005

(22) Filed: May 14, 2021

(51) Int. Cl.
*G01R 19/00* (2006.01)
*G11C 7/00* (2006.01)
*H03F 3/45* (2006.01)
*H03K 5/24* (2006.01)
*H03M 9/00* (2006.01)

(52) U.S. Cl.
CPC ........... *H03K 5/249* (2013.01); *H03K 5/2481* (2013.01); *H03M 9/00* (2013.01)

(58) Field of Classification Search
CPC ..... G11C 7/065; G11C 7/062; G11C 11/4091; H03K 3/356139; H03K 3/012
USPC .......................................................... 327/55
See application file for complete search history.

(56) References Cited

U.S. PATENT DOCUMENTS

| 5,508,648 A * | 4/1996 | Banik ................ H03K 3/35625 327/203 |
| 6,396,308 B1 | 5/2002 | Bosnyak et al. |
| 6,480,037 B1 | 11/2002 | Song et al. |
| 7,196,550 B1 * | 3/2007 | Reinschmidt .... H03K 3/356104 326/113 |
| 7,227,798 B2 | 6/2007 | Gupta et al. |
| 7,388,772 B1 * | 6/2008 | Xu ....................... G11C 11/4125 365/154 |
| 8,624,632 B2 | 1/2014 | Bulzacchelli |
| 11,095,273 B1 * | 8/2021 | Rasmus .................. H04L 25/03 |
| 2008/0012619 A1 * | 1/2008 | Morimura ........ H03K 3/356156 327/203 |
| 2009/0108881 A1 * | 4/2009 | Wilson ................ H03F 3/45183 327/57 |
| 2017/0179848 A1 * | 6/2017 | Shimizu ................ H02M 7/537 |
| 2020/0204184 A1 | 6/2020 | Rattan |

* cited by examiner

*Primary Examiner* — Quan Tra
(74) *Attorney, Agent, or Firm* — Loza & Loza, LLP

(57) ABSTRACT

A regeneration circuit includes a first inverting circuit having an input and an output, a second inverting circuit having an input and an output, a first transistor coupled to the input of the second inverting circuit, wherein a gate of the first transistor is configured to receive a first input signal, and a second transistor coupled to the input of the first inverting circuit, wherein a gate of the second transistor is configured to receive a second input signal. The regeneration circuit also includes a first switch coupled between the first transistor and the output of the first inverting circuit, wherein a control input of the first switch is configured to receive a timing signal, and a second switch coupled between the second transistor and the output of the second inverting circuit, wherein a control input of the second switch is configured to receive the timing signal.

28 Claims, 14 Drawing Sheets

DYNAMIC CROSS-COUPLED REGENERATION FOR HIGH-SPEED SENSE AMPLIFIER

BACKGROUND

Field

Aspects of the present disclosure relate generally to amplifiers, and more particularly, to sense amplifiers.

Background

Sense amplifiers are used in a wide range of applications including memories, analog-to-digital converters, and data samplers in high-speed serializer/deserializer (SerDes). In the case of a data sampler, a sense amplifier may include a regeneration circuit that provides the sense amplifier with regenerative feedback to quickly resolve incoming data bits in the data sampler. It is desirable to increase the regenerative gain of the regeneration circuit to increase the speed and sensitivity of the sense amplifier.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a regeneration circuit. The regeneration circuit includes a first inverting circuit having an input and an output, and a second inverting circuit having an input and an output. The regeneration circuit also includes a first transistor coupled to the input of the second inverting circuit, wherein a gate of the first transistor is configured to receive a first input signal, and a second transistor coupled to the input of the first inverting circuit, wherein a gate of the second transistor is configured to receive a second input signal. The regeneration circuit further includes a first switch coupled between the first transistor and the output of the first inverting circuit, wherein a control input of the first switch is configured to receive a timing signal, and a second switch coupled between the second transistor and the output of the second inverting circuit, wherein a control input of the second switch is configured to receive the timing signal.

A second aspect relates to a sense amplifier. The sense amplifier includes an input circuit and a regeneration circuit. The input circuit includes a first transistor, wherein a gate of the first transistor is configured to receive a first input signal, and a drain of the first transistor is coupled to a first output of the input circuit, and a second transistor, wherein a gate of the second transistor is configured to receive a second input signal, and a drain of the second transistor is coupled to a second output of the input circuit. The regeneration circuit includes a first inverting circuit having an input and an output, and a second inverting circuit having an input and an output. The regeneration circuit also includes a third transistor coupled to the input of the second inverting circuit, wherein a gate of the third transistor is coupled to the second output of the input circuit, and a fourth transistor coupled to the input of the first inverting circuit, wherein a gate of the fourth transistor is coupled to the first output of the input circuit. The regeneration circuit also includes a first switch coupled between the third transistor and the output of the first inverting circuit, wherein a control input of the first switch is configured to receive a timing signal, and a second switch coupled between the fourth transistor and the output of the second inverting circuit, wherein a control input of the second switch is configured to receive the timing signal.

A third aspect relates to a method of operating a regeneration circuit of a sense amplifier. The regeneration circuit includes a first inverting circuit having an input and an output, a second inverting circuit having an input and an output, a first transistor coupled to the input of the second inverting circuit, and a second transistor coupled to the input of the first inverting circuit. The method includes, in a reset phase, decoupling the output of the first inverting circuit from the first transistor, and decoupling the output of the second inverting circuit from the second transistor. The method also includes, in a sensing phase, coupling the output of the first inverting circuit to the first transistor, and coupling the output of the second inverting circuit to the second transistor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
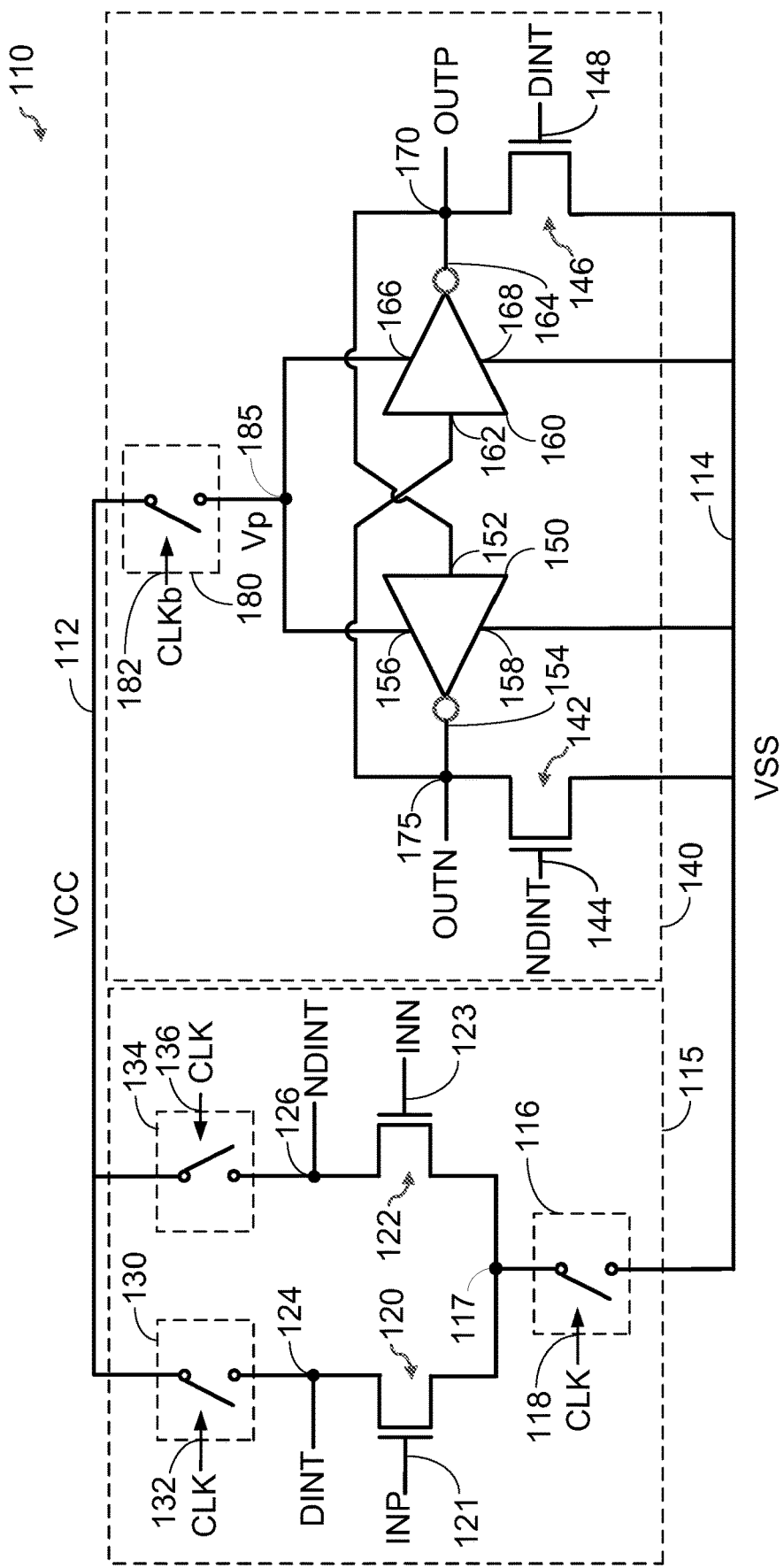
FIG. 1 shows an example of a sense amplifier including an input circuit and a regeneration circuit according to certain aspects of the present disclosure.

FIG. 1 shows an example of a sense amplifier 110 according to certain aspects of the present disclosure. The sense amplifier 110 may be used, for example, in a data sampler to sample and resolve incoming data bits. The sense amplifier 110 includes an input circuit 115 and a regeneration circuit 140. The input circuit 115 may also be referred to as an input stage and the regeneration circuit 140 may also be referred to as a regeneration stage.

The input circuit 115 includes a first input transistor 120, a second input transistor 122, a first switch 116, a second switch 130, and a third switch 134. The second switch 130 is coupled between a supply rail 112 and the first input transistor 120, and the third switch 134 is coupled between the supply rail 112 and the second input transistor 122. The first input transistor 120 is coupled between the second switch 130 and node 117, and the second input transistor 122 is coupled between the third switch 134 and node 117. The first switch 116 is coupled between node 117 and a ground 114.

In the example shown in FIG. 1, the first input transistor 120 is implemented with a first n-type field effect transistor (NFET) and the second input transistor 122 is implemented with a second NFET. In this example, the second switch 130 is coupled between the supply rail 112 and the drain of the first input transistor 120, and the first switch 116 is coupled between the source of the first input transistor 120 and the ground 114. Also, the third switch 134 is coupled between the supply rail 112 and the drain of the second input transistor 122, and the first switch 116 is coupled between the source of the second input transistor 122 and the ground 114. It is to be appreciated that the first input transistor 120 and the second input transistor 122 are not limited to NFETs and may be implemented with other types of transistors.

The input circuit 115 is configured to receive a differential input signal (e.g., differential data signal) that includes a first input voltage (labeled "INP") and a second input voltage (labeled "INN"). The first input voltage INP is input to a first input 121 of the input circuit 115 and the second input voltage INN is input to a second input 123 of the input circuit 115, in which the first input 121 is coupled to the gate of the first input transistor 120 and the second input 123 is coupled to the gate of the second input transistor 122. The differential input signal may have a small differential voltage (i.e., a small difference between the first input voltage INP and the second input voltage INN) in which the polarity of the differential voltage represents a bit value. As discussed further below, the sense amplifier 110 is configured to convert the small differential input voltage into a large differential output voltage to resolve the bit value.

The first switch 116 has a control input 118 driven by a first timing signal, the second switch 130 has a control input 132 driven by the first timing signal, and the third switch 134 has a control input 136 driven by the first timing signal. In one example, the first switch 116 is configured to turn on when the first timing signal is high and turn off when the first timing signal is low, and each one of the second switch 130 and the third switch 134 is configured to turn on when the first timing signal is low and turn off when the first timing signal is high. In the example shown in FIG. 1, the first timing signal is a clock signal (labeled "CLK"). As used herein, a "clock signal" is a periodic signal that oscillates between a high logic state and a low logic state. In certain aspects, a high logic state (i.e., logic state of one) may correspond to a voltage approximately equal to a supply voltage VCC and a low logic state (i.e., logic state of zero) may correspond to a voltage approximately equal to ground.

As used herein, a "control input" of a switch is an input that controls the on/off state of the switch based on a signal (e.g., a voltage of the signal) at the control input. For an example where a switch is implemented with a transistor, the control input is located at the gate of the transistor.

The input circuit 115 has a first output 124 located at a node between the second switch 130 and the first input transistor 120, and a second output 126 located at a node between the third switch 134 and the second input transistor 122. The voltage at the first output 124 (labeled "DINT") and the voltage at the second output 126 (labeled "NDINT") are output to the regeneration circuit 140, as discussed further below. In the example in FIG. 1, the first output 124 is coupled to the drain of the first input transistor 120, and the second output 126 is coupled to the drain of the second input transistor 122.

The regeneration circuit 140 includes a first input transistor 142, a second input transistor 146, a switch 180, a first inverting circuit 150, and a second inverting circuit 160. As discussed further below, the first inverting circuit 150 and the second inverting circuit 160 are cross coupled to provide regenerative feedback. As used herein, an "inverting circuit" is a circuit configured to invert a logic state (i.e., logic level or logic value) at an input of the inverting circuit and output the inverted logic state at an output of the inverting circuit. The logic state may be represented by a voltage in which a low voltage (e.g., approximately ground) may represent a logic state of zero and a high voltage (e.g., approximately a supply voltage) may represent a logic state of one. In certain aspects, an inverting circuit has a threshold voltage in which the output of the inverting circuit transitions from low to high when the voltage at the input of the inverting circuit falls below the threshold voltage, and the output of the inverting circuit transitions from high to low when the voltage at the input of the inverting circuit rises above the threshold voltage. An inverting circuit may also be referred to as an inverter, an inverting circuit, or another term.

The regeneration circuit 140 has a first input 144 coupled to the second output 126 of the input circuit 115, and a second input 148 coupled to the first output 124 of the input circuit 115. Thus, the first input 144 receives the voltage NDINT from the input circuit 115 and the second input 148 receives the voltage DINT from the input circuit 115. In this regard, the voltage NDINT may be considered a first input signal to the regeneration circuit 140 and the voltage DINT may be considered a second input signal to the regeneration circuit 140.

The first inverting circuit 150 has an input 152, an output 154, a first supply terminal 156, and a second supply terminal 158. The second inverting circuit 160 has an input 162, an output 164, a first supply terminal 166, and a second supply terminal 168. To cross couple the first inverting circuit 150 and the second inverting circuit 160, the input 152 of the first inverting circuit 150 is coupled to the output 164 of the second inverting circuit 160, and the input 162 of the second inverting circuit 160 is coupled to the output 154 of the first inverting circuit 150. The cross coupling of the first inverting circuit 150 and the second inverting circuit 160 provide the regeneration circuit 140 with regenerative feedback. The regenerative feedback allows the regeneration circuit 140 to achieve regeneration for quickly resolving the values of data bits, as discussed further below.

The first supply terminal 156 of the first inverting circuit 150 and the first supply terminal 166 of the second inverting circuit 160 are coupled to a supply node 185. The second supply terminal 158 of the first inverting circuit 150 and the second supply terminal 168 of the second inverting circuit 160 are coupled to the ground 114. In this example, a first output 170 of the regeneration circuit 140 is coupled to the output 164 of the second inverting circuit 160, and a second output 175 of the regeneration circuit 140 is coupled to the output 154 of the first inverting circuit 150.

The first input transistor 142 is coupled between the output 154 of the first inverting circuit 150 and the ground 114. The gate of the first input transistor 142 is coupled to the first input 144 of the regeneration circuit 140. Thus, the gate of the first input transistor 142 is configured to receive the voltage NDINT (i.e., the first input signal to the regeneration circuit 140). In one example, the first input transistor 142 is configured to turn on when the voltage NDINT is above a threshold voltage of the first input transistor 142 and turn off when the voltage NDINT is below the threshold voltage of the first input transistor 142. In the example shown in FIG. 1, the first input transistor 142 is implemented with an NFET, in which the drain of the first input transistor 142 is coupled to the output 154 of the first inverting circuit 150 and the source of the first input transistor 142 is coupled to the ground 114. However, it is to be appreciated that the first input transistor 142 may be implemented with another type of transistor.

The second input transistor 146 is coupled between the output 164 of the second inverting circuit 160 and the ground 114. The gate of the second input transistor 146 is coupled to the second input 148 of the regeneration circuit 140. Thus, the gate of the second input transistor 146 is configured to receive the voltage DINT (i.e., the second input signal to the regeneration circuit 140). In one example, the second input transistor 146 is configured to turn on when the voltage DINT is above a threshold voltage of the second input transistor 146 and turn off when the voltage DINT is below the threshold voltage of the second input transistor 146. In the example shown in FIG. 1, the second input transistor 146 is implemented with an NFET, in which the drain of the second input transistor 146 is coupled to the output 164 of the second inverting circuit 160 and the source of the second input transistor 146 is coupled to the ground 114. However, it is to be appreciated that the second input transistor 146 may be implemented with another type of transistor.

The switch 180 is coupled between the supply rail 112 and the supply node 185. The switch 180 has a control input 182 driven by a second timing signal. In one example, the second timing signal is a complement of the first timing signal. For the example in which the first timing signal is a clock signal CLK, the second timing signal may be a complementary clock signal (labeled "CLKb"), which may be generated by inverting the clock signal CLK with an inverting circuit (not shown). In one example, the switch 180 is configured to turn on when the second timing signal is low (e.g., first timing signal is high) and turn off when the second timing signal is high (e.g., first timing signal is low).

Figure 2:
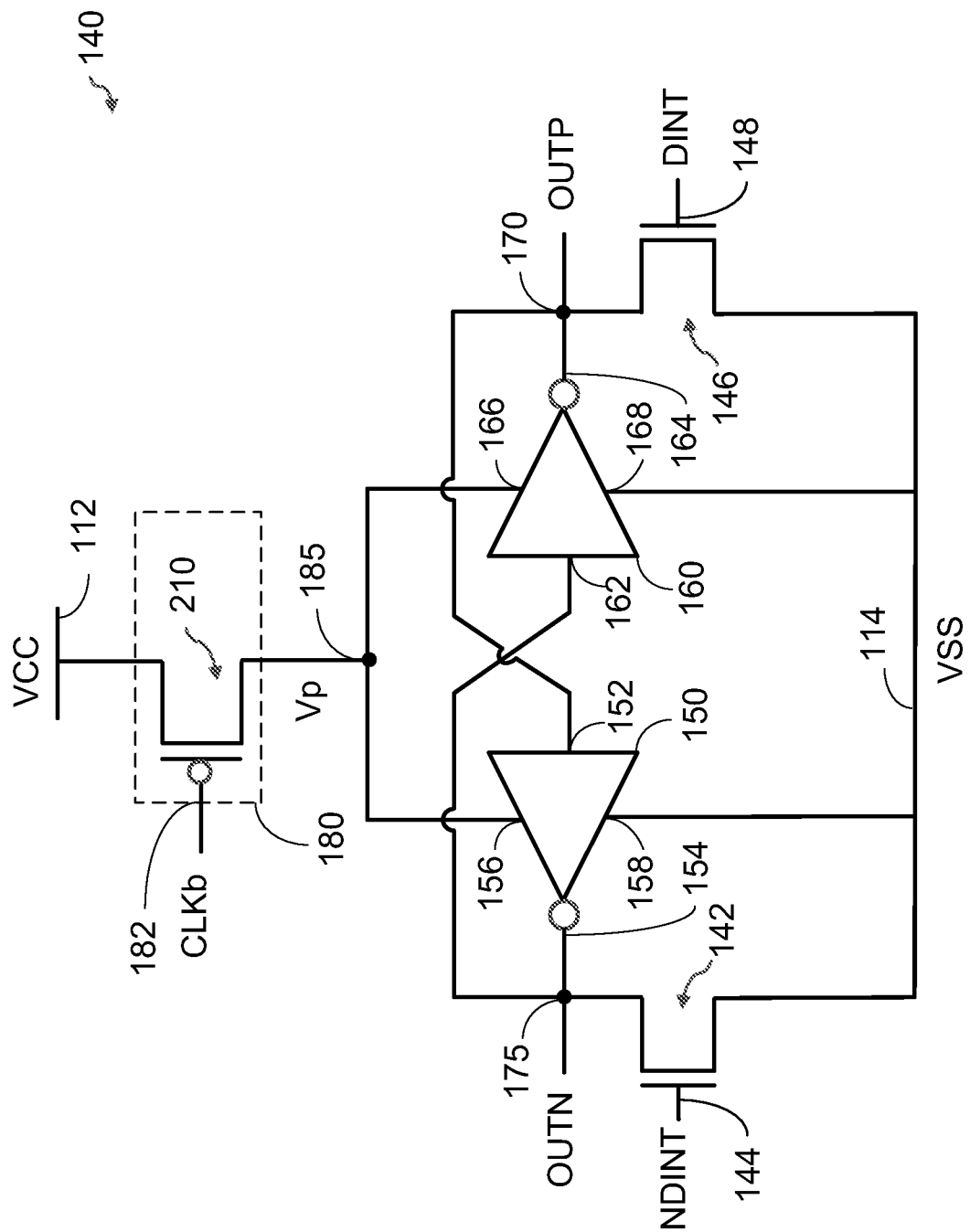
FIG. 2 shows an exemplary implementation of a switch in the regeneration circuit according to certain aspects of the present disclosure.

FIG. 2 shows an example in which the switch 180 is implemented with a PFET 210 in which the source of the PFET 210 is coupled to the supply rail 112, the gate of the PFET 210 is coupled to the control input 182, and the drain of the PFET 210 is coupled to the supply node 185.

Exemplary operations of the sense amplifier 110 will now be discussed according to certain aspects.

When the first timing signal (e.g., the clock signal CLK) is low, the sense amplifier 110 is in a reset phase. In the reset phase, the first switch 116 in the input circuit 115 is turned off. As a result, the first switch 116 decouples the first input transistor 120 and the second input transistor 122 from the ground 114. The second switch 130 and the third switch 134 are turned on. As a result, the second switch 130 couples the first output 124 to the supply rail 112 and the third switch 134 couples the second output 126 to the supply rail 112. This causes the first output 124 to be pulled up to VCC (i.e., the supply voltage on the supply rail 112) and the second output 126 to be pulled up to VCC. Thus, the voltage NDINT input to the gate of the first input transistor 142 of the regeneration circuit 140 and the voltage DINT input to the gate of the second input transistor 146 of the regeneration circuit 140 are both pulled up to VCC.

In the reset phase, the switch 180 in the regeneration circuit 140 is turned off since the second timing signal is the complement of the first timing signal and is therefore high when the first timing signal is low. As a result, the switch 180 decouples the first supply terminal 156 of the first inverting circuit 150 from the supply rail 112 and decouples the first supply terminal 166 of the second inverting circuit 160 from the supply rail 112. This disables current flow from the supply rail 112 to the first supply terminals 156 and 166 of the inverting circuits 150 and 160.

In the reset phase, the first input transistor 142 and the second input transistor 146 of the regeneration circuit 140 are both turned on since the voltage DINT and the voltage NDINT are both pulled up to the supply voltage VCC (assuming VCC is greater than the threshold voltage of the first input transistor 142 and the threshold voltage of the second input transistor 146). As a result, the first input transistor 142 pulls the output 154 of the first inverting circuit 150 to ground and pulls the input 162 of the second inverting circuit 160 to ground, and the second input transistor 146 pulls the output 164 of the second inverting circuit 160 to ground and pulls the input 152 of the first inverting circuit 150 to ground.

Figure 3:
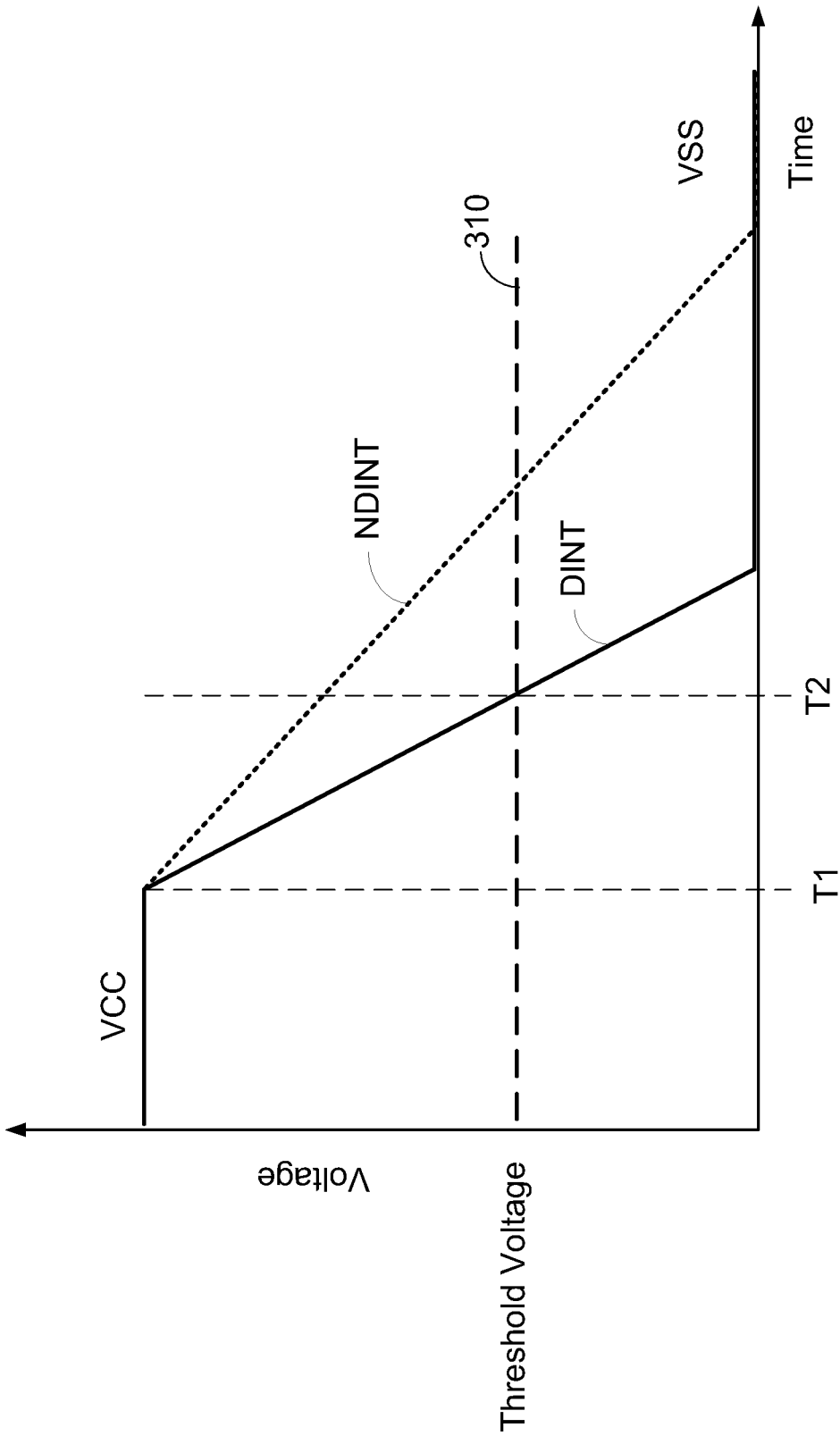
FIG. 3 is a timing diagram showing an example of voltages output by the input circuit to the regeneration circuit according to certain aspects of the present disclosure.

When the first timing signal (e.g., the clock signal CLK) transitions from low to high, the sense amplifier 110 enters a sensing phase in which the input circuit 115 senses the differential input signal (e.g., differential data signal) at the inputs 121 and 123 of the input circuit 115. FIG. 3 shows an example of the voltages DINT and NDINT during the sensing phase for the case where the input voltage INP is higher than the input voltage INN, which may represent a bit value of one. In this example, the first timing signal (e.g., clock signal CLK) transitions from low to high at time T1. Also, in this example, the first input transistor 142 and the second input transistor 146 have the same threshold voltage 310, which is shown in FIG. 3.

At time T1, the first switch 116 turns on, and the second switch 130 and the third switch 134 turn off. This allows the first input transistor 120 to pull down the voltage DINT at the first output 124 based on the input voltage INP driving the first input transistor 120, and the second input transistor 122 to pull down the voltage NDINT at the second output 126 based on the input voltage INN driving the second input transistor 122. In this example, the voltage DINT at the first output 124 is pulled down at a faster rate than the voltage NDINT at the second output 126. This is because the first input transistor 120 is driven by a higher voltage than the second input transistor 122 in this example (i.e., INP>INN).

Figure 4:
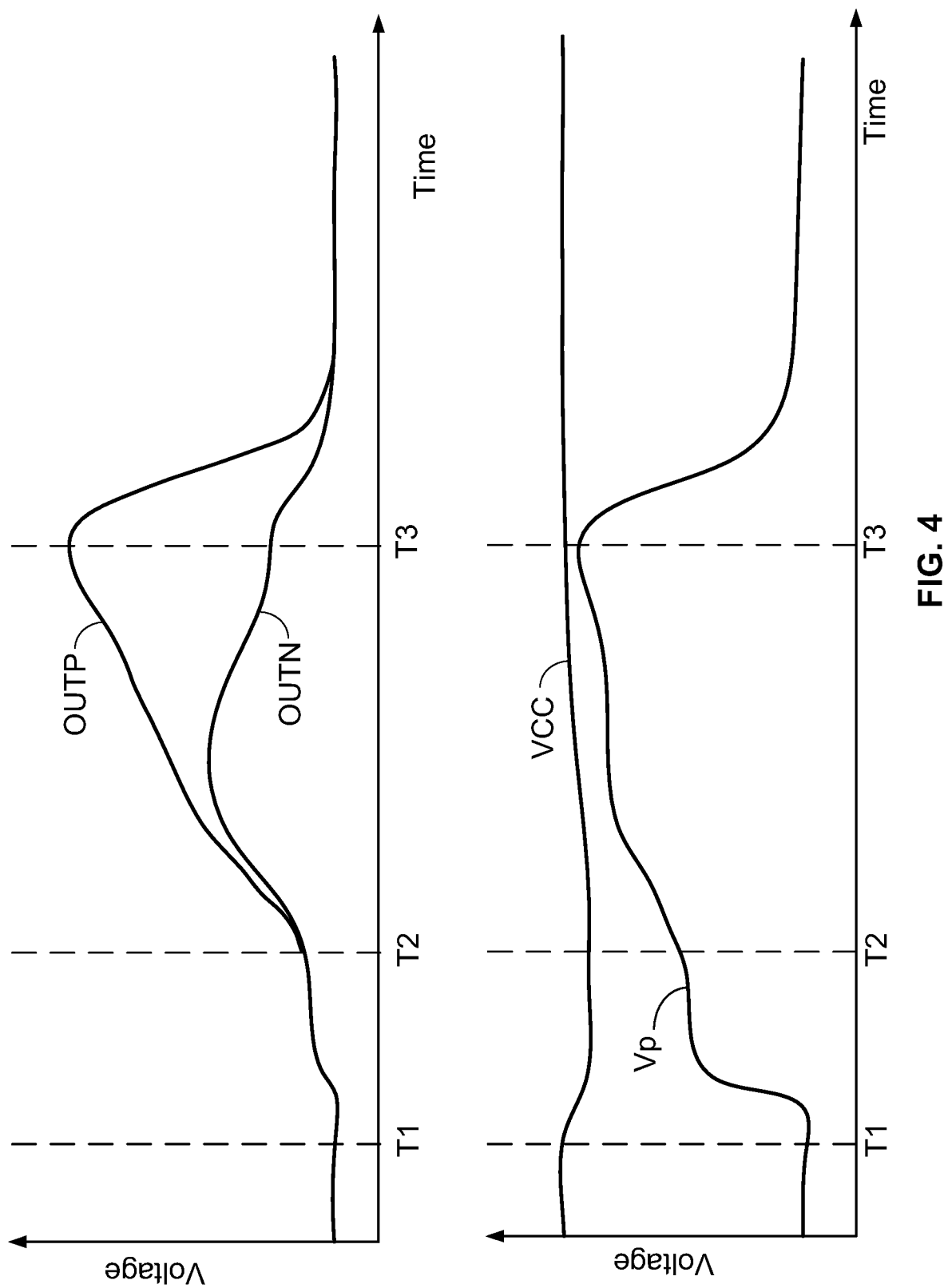
FIG. 4 is a timing diagram showing an example of output voltages of the regeneration circuit during a sensing phase and a decision phase according to certain aspects of the present disclosure.

At time T2, the voltage DINT falls below the threshold voltage 310, which turns off the second input transistor 146 of the regeneration circuit 140. The first input transistor 142 of the regeneration circuit 140 is still turned on at time T2 since the voltage NDINT is still above the threshold voltage at time T2. At time T2, the regeneration circuit 140 transitions from the sensing phase to a decision phase in which the turning off of the second input transistor 146 triggers the regenerative feedback of the regeneration circuit 140, which is provided by the cross coupling of the inverting circuits 150 and 160, as discussed above. In this example, the regenerative feedback pulls up the first output 170 and pulls down the second output 175. An example of this is illustrated in FIG. 4, which shows an example of the output voltage OUTP at the first output 170 and the output voltage OUTN at the second output 175. As shown in FIG. 4, the regenerative feedback pulls up the first output 170 and pulls down the second output 175 resulting in a large differential output voltage at the outputs 170 and 175 of the regeneration circuit 140 representing the resolved bit value. In this example, the output voltage OUTP is higher than the output voltage OUTN, which may represent a bit decision of one.

At time T3, the first timing signal transitions from high back to low, causing the sense amplifier 110 to return to the reset phase and each of the output voltages OUTP and OUTN to return to the reset voltage of approximately zero volts (i.e., ground). Just before time T3, a latch (not shown) coupled to the outputs 170 and 175 of the regeneration circuit 140 may latch the resolved bit value. The latch may include a set-reset (S-R) latch or another type of latch.

The sensing phase and the decision phase are discussed above for the case where the input voltage INP is higher than the input voltage INN. For the case where the input voltage INN is higher than the input voltage INP, the voltage NDINT at the second output 126 of the input circuit 115 falls below the threshold voltage 310 before the voltage DINT at the first output 124 of the input circuit 115 during the sensing phase, causing the first input transistor 142 to turn off before the second input transistor 146. When this occurs, the sense amplifier 110 transitions from the sensing phase to the decision phase in which the turning off of the first input transistor 142 triggers the regenerative feedback of the regeneration circuit 140. As discussed above, the regenerative feedback is provided by the cross coupling of the inverting circuits 150 and 160. In this case, the regenerative feedback pulls up the second output 175 and pulls down the first output 170, resulting in a large differential output voltage in which the output voltage OUTN is higher than the output voltage OUTP, which may represent a bit decision of zero.

In the above example, the first switch 116 is turned on, the second switch 130 and the third switch 134 are turned off, and the switch 180 is turned on during the sensing phase and the decision phase. The sense amplifier 110 enters the decision phase when one of the voltages DINT and NDINT falls below the threshold voltage 310 of the input transistors 142 and 146, which triggers the regenerative feedback of the regeneration circuit 140 to resolve a bit value (i.e., make a bit decision), as discussed above.

The cross coupling of the inverting circuits 150 and 160 provides regenerative gain when the first supply terminals 156 and 166 of the inverting circuits 150 and 160 are coupled to the supply rail 112 through the switch 180. The inverting circuits 150 and 160 may draw a large current from the supply rail 112 through the switch 180 during the sensing phase, causing a large current-resistance (IR) voltage drop to appear across the switch 180. The large IR voltage drop reduces the supply voltage (labeled "Vp") at the first supply terminals 156 and 166 of the inverting circuits 150 and 160. An example of this is illustrated in FIG. 4, which shows an example of the supply voltage VCC at the supply rail 112 and the supply voltage Vp at the supply node 185, which is coupled to the first supply terminals 156 and 166 of the inverting circuits 150 and 160. As shown in FIG. 4, at the start of the decision phase at time T2, the supply voltage Vp at the supply node 185 may be substantially lower (e.g., over 30 percent lower) than the supply voltage VCC at the supply rail 112 due to the IR voltage drop across the switch 180. The lower supply voltage Vp may substantially reduce the regenerative gain provided by the cross-coupled inverting circuits 150 and 160, which substantially slows down the speed with which the regeneration circuit 140 can render a bit decision and reduces the sensitivity of the sense amplifier 110.

To address the above, aspects of the present disclosure provide a regeneration circuit including a first switch coupled between the first input transistor 142 and the output 154 of the first inverting circuit 150, and a second switch coupled between the second input transistor 146 and the output 164 of the second inverting circuit 160. As discussed further below, the first and second switches increase the regenerative gain of the cross-coupled inverting circuits 150 and 160 during the decision phase by eliminating the need for the switch 180 and thus eliminating the reduction in the supply voltage at the first supply terminals 156 and 166 of the inverting circuits 150 and 160 caused by the IR voltage drop across the switch 180. In addition, the first switch is located outside the current path between the input 162 of the second inverting circuit 160 and the first input transistor 142, and the second switch is located outside the current path between the input 152 of the first inverting circuit 150 and the second input transistor 146. As discussed further below, this feature substantially reduces the current flow through the first switch and the second switch during the sensing phase and the decision phase, which substantially reduces degradation in the performance of the regeneration circuit 140 caused by the presence of the first switch and the second switch.

Figure 5:
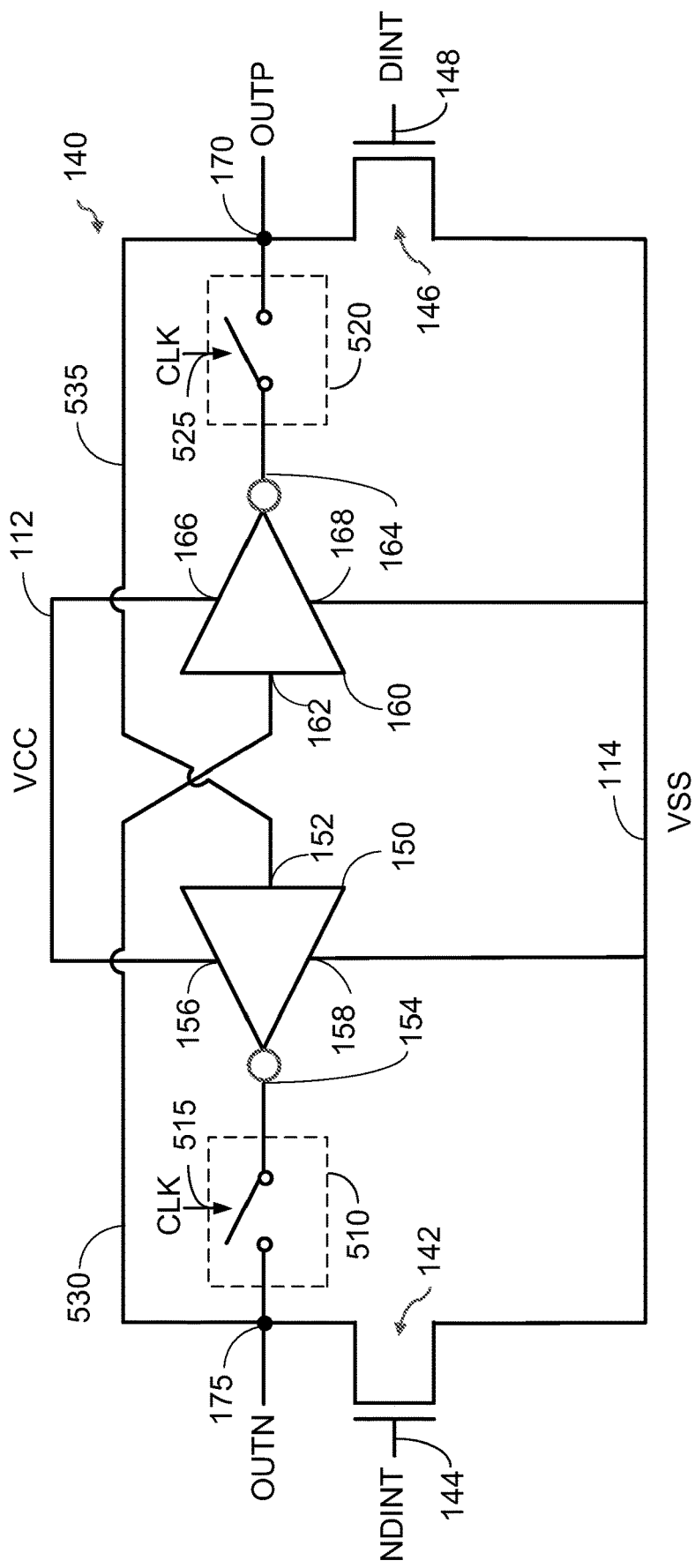
FIG. 5 shows an example of a regeneration circuit according to certain aspects of the present disclosure.

FIG. 5 shows an example of the regeneration circuit 140 according to certain aspects of the present disclosure. The regeneration circuit 140 may be coupled to the exemplary input circuit 115 shown in FIG. 1. The regeneration circuit 140 includes the first inverting circuit 150, the second inverting circuit 160, the first input transistor 142, and the second input transistor 146 discussed above.

The input 162 of the second inverting circuit 160 is coupled to the first input transistor 142, and the input 152 of the first inverting circuit 150 is coupled to the second input transistor 146. In certain aspects, the input 162 of the second inverting circuit 160 is directly coupled to the first input transistor 142 via first metal routing 530, and the input 152 of the first inverting circuit 150 is directly coupled to the second input transistor 146 via second metal routing 535. The first metal routing 530 and the second metal routing 535 may each include one or more metal layers on a chip, and one or more metal interconnect structures (e.g., vias) coupling the one or more metal layers. As used herein, the term "directly coupled" refers to coupling between two devices with no intervening device (e.g., a switch).

For the example where the first input transistor 142 is implemented with an NFET, the drain of the first input transistor 142 is coupled (e.g., directly coupled via the first metal routing 530) to the input 162 of the second inverting circuit 160, the gate of the first input transistor 142 is coupled to the first input 144 of the regeneration circuit 140, and the source of the first input transistor 142 is coupled to the ground 114. For the example where the second input transistor 146 is implemented with an NFET, the drain of the second input transistor 146 is coupled (e.g., directly coupled via the second metal routing 535) to the input 152 of the first inverting circuit 150, the gate of the second input transistor 146 is coupled to the second input 148 of the regeneration circuit 140, and the source of the second input transistor 146 is coupled to the ground 114. However, it is to be appreciated that the first input transistor 142 and the second input transistor 146 are not limited to this example and that each of the first input transistor 142 and the second input transistor 146 may be implemented with a PFET or another type of transistor.

In this example, the first supply terminal 156 of the first inverting circuit 150 and the first supply terminal 166 of the second inverting circuit 160 are coupled to the supply rail 112. In certain aspects, the first supply terminal 156 of the first inverting circuit 150 and the first supply terminal 166 of the second inverting circuit 160 are directly coupled (e.g., via metal routing) to the supply rail 112, in which the switch 180 shown in FIGS. 1 and 2 is omitted. The direct coupling substantially increases the supply voltage at the first supply terminals 156 and 166 of the inverting circuits 150 and 160 compared with the regeneration circuit 140 in FIGS. 1 and 2 by eliminating the reduction in the supply voltage at the first supply terminals 156 and 166 of the inverting circuits 150 and 160 due to the IR voltage drop across the switch 180. The second supply terminal 158 of the first inverting circuit 150 and the second supply terminal 168 of the second inverting circuit 160 are coupled to the ground 114.

The regeneration circuit 140 also includes a first switch 510 and a second switch 520. The first switch 510 is coupled between the first input transistor 142 and the output 154 of the first inverting circuit 150, and the second switch 520 is coupled between the second input transistor 146 and the output 164 of the second inverting circuit 160. For the example where each of the input transistors 142 and 146 is implemented with an NFET, the first switch 510 is coupled between the drain of the first input transistor 142 and the output 154 of the first inverting circuit 150, and the second switch 520 is coupled between the drain of the second input transistor 146 and the output 164 of the second inverting circuit 160.

In the example in FIG. 5, the first switch 510 has a control input 515 driven by a timing signal (e.g., the clock signal CLK), and the second switch 520 has a control input 525 driven by the timing signal. The timing signal may be the same timing signal used to control the switches 116, 130 and 134 in the exemplary input circuit 115 shown in FIG. 1 or another timing signal. In certain aspects, the first switch 510 and the second switch 520 are configured to turn off when the timing signal is in a first logic state (e.g., low) and turn on when the timing signal is in a second logic state (e.g., high). As discussed further below, the timing signal is in the first logic state during the reset phase and in the second logic state during the sensing phase and the decision phase. Thus, the first switch 510 and the second switch 520 are turned off during the reset phase and turned on during the sensing phase and the decision phase.

Exemplary operations of the exemplary regeneration circuit 140 shown in FIG. 5 will now be discussed according to certain aspects of the present disclosure.

When the timing signal (e.g., the clock signal CLK) is in the first logic state (e.g., low), the regeneration circuit 140 is in the reset phase. In the reset phase, the timing signal turns off the first switch 510 and the second switch 520. Turning off the first switch 510 decouples the input 162 of the second inverting circuit 160 from the output 154 of the first inverting circuit 150, which breaks the regenerative feedback path between the input 162 of the second inverting circuit 160 and the output 154 of the first inverting circuit 150. Turning off the second switch 520 decouples the input 152 of the first inverting circuit 150 from the output 164 of the second inverting circuit 160, which breaks the regenerative feedback path between the input 152 of the first inverting circuit 150 and the output 164 of the second inverting circuit 160.

By breaking the regenerative feedback paths during the reset phase, the first switch 510 and the second switch 520 disable the regenerative feedback of the regeneration circuit 140 during the reset phase. In contrast, the regenerative feedback is disabled during the reset phase in FIGS. 1 and 2 by turning off the switch 180, which decouples the first supply terminals 156 and 166 of the inverting circuits 150 and 160 from the supply rail 112 and therefore cuts off power from the supply rail 112 to the inverting circuits 150 and 160. Thus, the first switch 510 and the second switch 520 allow the timing signal to disable the regenerative feedback of the regeneration circuit 140 during the reset phase without the switch 180 in FIGS. 1 and 2. This eliminates the need for the switch 180, which allows the first supply terminals 156 and 166 of the inverting circuits 150 and 160 to be directly coupled to the supply rail 112. As discussed further below, the first switch 510 and the second switch 520 may also disable current flow from the supply rail 112 to the ground 114 during the reset phase.

As discussed above, the voltage NDINT at the first input 144 of the regeneration circuit 140 and the voltage DINT at the second input 148 of the regeneration circuit 140 are pulled up to VCC by the input circuit 115 during the reset phase. As a result, the voltage NDINT is above the threshold voltage of the first input transistor 142, and the voltage DINT is above the threshold voltage of the second input transistor 146 (assuming VCC is above the threshold voltage of each of the first input transistor 142 and the second input transistor 146). This causes the first input transistor 142 to turn on and pull down the input 162 of the second inverting circuit 160 to the ground 114, and the second input transistor 146 to turn on and pull down the input 152 of the first inverting circuit 150 to the ground 114.

When the timing signal (e.g., the clock signal CLK) transitions from the first logic state (e.g., low) to the second logic state (e.g., high), the regeneration circuit 140 enters the sensing phase and the timing signal turns on the first switch 510 and the second switch 520. Turning on the first switch 510 couples the input 162 of the second inverting circuit 160 to the output 154 of the first inverting circuit 150 through the first switch 510, and turning on the second switch 520 couples the input 152 of the first inverting circuit 150 to the output 164 of the second inverting circuit 160 through the second switch 520. As a result, the first inverting circuit 150 and the second inverting circuit 160 are cross coupled through the switches 510 and 520. This enables the regenerative feedback of the regeneration circuit 140 in the sensing phase. The regenerative feedback allows the regeneration circuit 140 to achieve regeneration.

As discussed above, the first supply terminals 156 and 166 of the inverting circuits 150 and 160 may be directly coupled to the supply rail 112, which substantially increases the supply voltage at the first supply terminals 156 and 166 of the inverting circuits 150 and 160 compared with the example shown in FIGS. 1 and 2 in which the IR voltage drop across the switch 180 substantially reduces the supply voltage at the first supply terminals 156 and 166 of the inverting circuits 150 and 160. The increased supply voltage at the first supply terminals 156 and 166 of the inverting circuits 150 and 160 increases the regenerative gain of the regeneration circuit 140, which increases the speed with which the regeneration circuit 140 can render a bit decision and increases the sensitivity of the sense amplifier 110.

As discussed above, during the sensing phase, the input circuit 115 pulls down the voltage NDINT at the first input 144 of the regeneration circuit 140 and pulls down the voltage DINT at the second input 148 of the regeneration circuit 140 at different rates depending on the polarity of the differential signal (e.g., differential data signal) input to the input circuit 115. The regeneration circuit 140 transitions from the sensing phase to the decision phase when one of the voltages NDINT and DINT falls below the threshold voltage 310 of the first input transistor 142 and the second input transistor 146, which triggers the regenerative feedback of the regeneration circuit 140 to make a bit decision. As discussed above, the regeneration feedback is enabled by the cross coupling of the inverting circuits 150 and 160 through the switches 510 and 520 (which are both turned on). The regenerative feedback causes the regeneration circuit 140 to pull one of the outputs 170 and 175 high and pull the other one of the outputs 170 and 175 low to resolve the bit value depending on which of the voltages NDINT and DINT falls below the threshold voltage 310 first, as discussed above.

The presence of the first switch 510 and the second switch 520 may potentially cause a large voltage offset at the outputs 170 and 175 of the regeneration circuit 140, which degrades the performance of the regeneration circuit 140 and may need to be calibrated out. The large voltage offset may be caused by a difference in the IR voltage drop across the first switch 510 and the IR voltage drop across the second switch 520 during the sensing phase and decision phase, which is amplified by the regenerative gain of the regeneration circuit 140. The difference in the IR voltage drops across the switches 510 and 520 may be due to, for example, mismatches in the first switch 510 and the second switch 520. The voltage offset caused by the difference in the IR voltage drops across the switches 510 and 520 can be substantially reduced by substantially reducing the IR voltage drops across the switches 510 and 520, as discussed further below.

As shown in FIG. 5, the first switch 510 is located outside the current path between the input 162 of the second inverting circuit 160 and the first input transistor 142. This is because the first switch 510 is coupled between the first input transistor 142 and the output 154 of the first inverting circuit 150. As a result, the current flowing between the input 162 of the second inverting circuit 160 and the first input transistor 142 during the sensing phase and the decision phase does not flow through the first switch 510, which substantially reduces the IR voltage drop across the first switch 510.

Similarly, the second switch 520 is located outside the current path between the input 152 of the first inverting circuit 150 and the second input transistor 146. This is because the second switch 520 is coupled between the second input transistor 146 and the output 164 of the second inverting circuit 160. As a result, the current flowing between the input 152 of the first inverting circuit 150 and the second input transistor 146 during the sensing phase and the decision phase does not flow through the second switch 520, which substantially reduces the IR voltage drop across the second switch 520.

Thus, locating the first switch 510 outside the current path between the input 162 of the second inverting circuit 160 and the first input transistor 142 and locating the second switch 520 outside the current path between the input 152 of the first inverting circuit 150 and the second input transistor 146 substantially reduce the current flow through the first switch 510 and the current flow through the second switch 520 during the sensing and decision phases. The reduced current flows through the first switch 510 and the second switch 520 substantially reduce the IR voltage drops across the first switch 510 and the second switch 520. The substantially reduced IR voltage drops across the first switch 510 and the second switch 520 substantially reduces the impact of the IR voltage drops on the voltage offset of the regeneration circuit 140, resulting in a substantially smaller voltage offset due to the difference in the IR voltage drops.

Figure 6A:
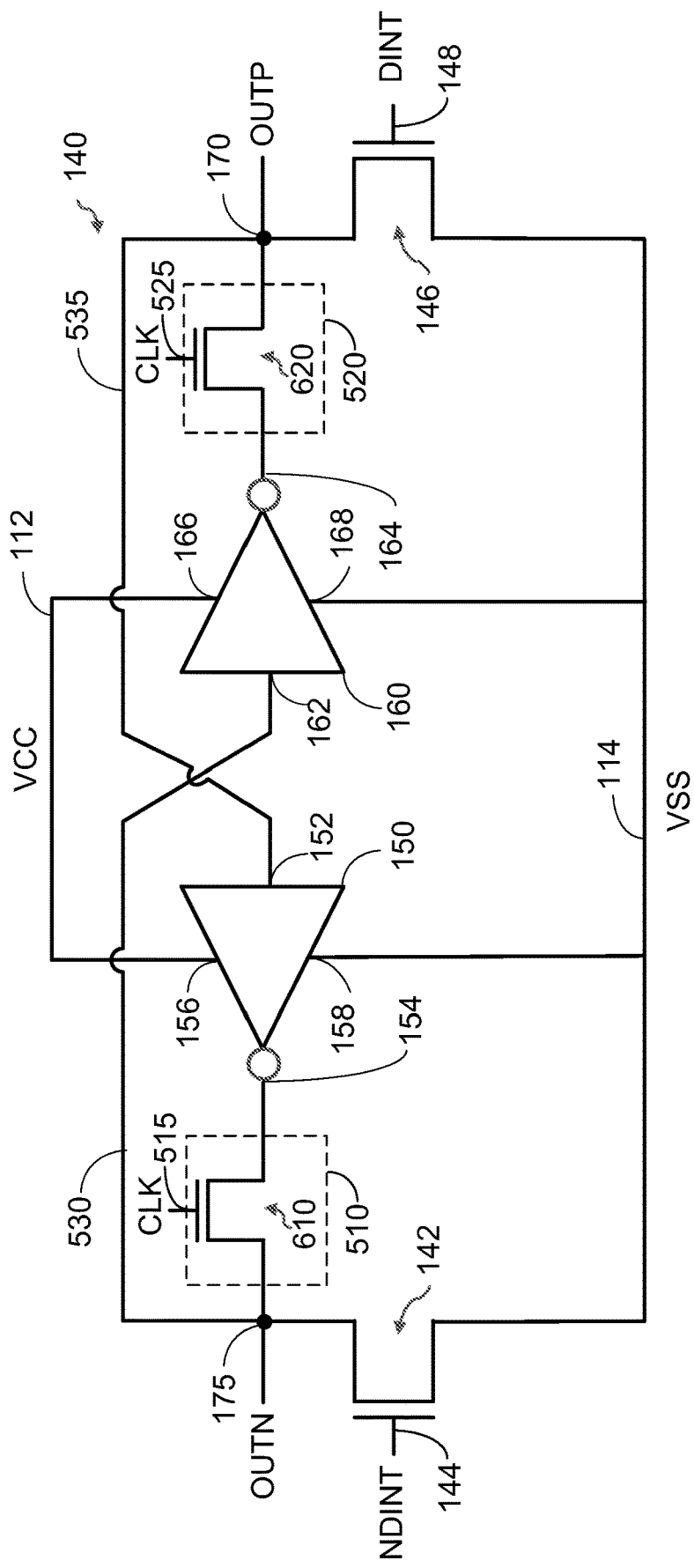
FIG. 6A shows an exemplary implementation of switches in the regeneration circuit according to certain aspects of the present disclosure.

FIG. 6A shows an example in which the first switch 510 is implemented with a first NFET 610, and the second switch 520 is implemented with a second NFET 620. In this example, one of the source and the drain of the first NFET 610 is coupled to the first input transistor 142 (e.g., the drain of the first input transistor 142), the other one of the source and the drain of the first NFET 610 is coupled to the output 154 of the first inverting circuit 150, and the gate of the first NFET 610 is coupled to the control input 515 to receive the timing signal (e.g., the clock signal CLK). One of the source and the drain of the second NFET 620 is coupled to the second input transistor 146 (e.g., the drain of the second input transistor 146), the other one of the source and the drain of the second NI-ET 620 is coupled to the output 164 of the second inverting circuit 160, and the gate of the second NFET 620 is coupled to the control input 525 to receive the timing signal (e.g., the clock signal CLK).

In this example, the first switch 510 and the second switch 520 are turned off when the timing signal is low and are turned on when the timing signal is high. Thus, in this example, the regeneration circuit 140 is in the reset phase when the timing signal is low, and in the sensing phase and the decision phase when the timing signal is high.

Figure 6B:
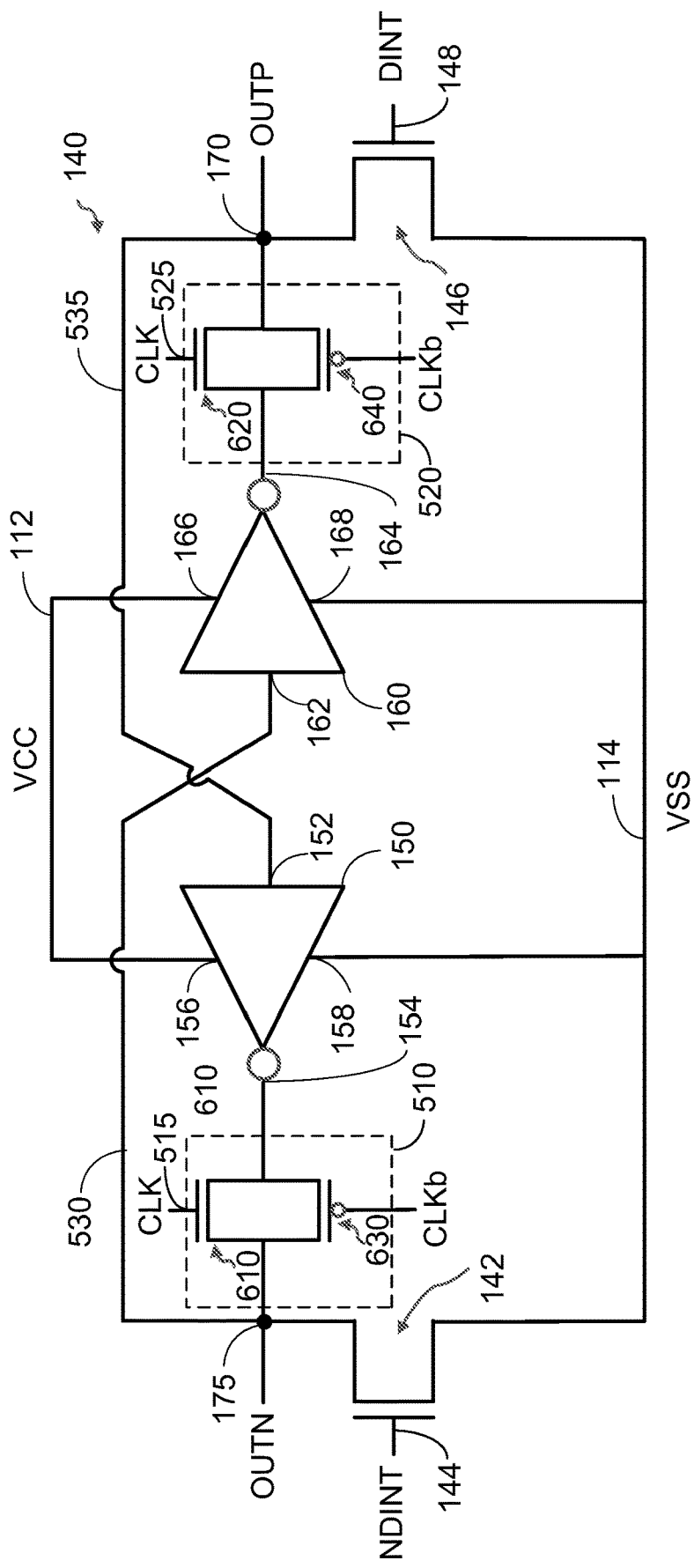
FIG. 6B shows another exemplary implementation of switches in the regeneration circuit according to certain aspects of the present disclosure.

It is to be appreciated that the first switch 510 and the second switch 520 are not limited to the exemplary implementation shown in FIG. 6A, and that each of the first switch 510 and the second switch 520 may be implemented with another type of transistor, a transmission gate, or another type of switch. For example, FIG. 6B shows an example in which the first switch 510 also includes a first PFET 630 coupled in parallel with the first NI-ET 610. In this example, the first NFET 610 and the first PFET 630 form a transmission gate (e.g., complementary metal oxide semiconductor (CMOS) transmission gate) in which the gate of the first PFET 630 is driven by the complement of the timing signal (e.g., complementary clock signal CLKb). Also, in this example, the second switch 520 also includes a second PI-ET 640 coupled in parallel with the second NFET 620. In this example, the second NFET 620 and the second PFET 640 form a transmission gate in which the gate of the second PFET 640 is driven by the complement of the timing signal (e.g., complementary clock signal CLKb). In some implementations, the NFETs 610 and 620 may be omitted from the switches 510 and 520 with the first PFET 630 coupled between the first input transistor 142 (e.g., drain of the first input transistor 142) and the output 154 of the first inverting circuit 150 and the second PFET 640 coupled between the second input transistor 146 (e.g., drain of the second input transistor 146) and the output 164 of the second inverting circuit 160.

Figure 7A:
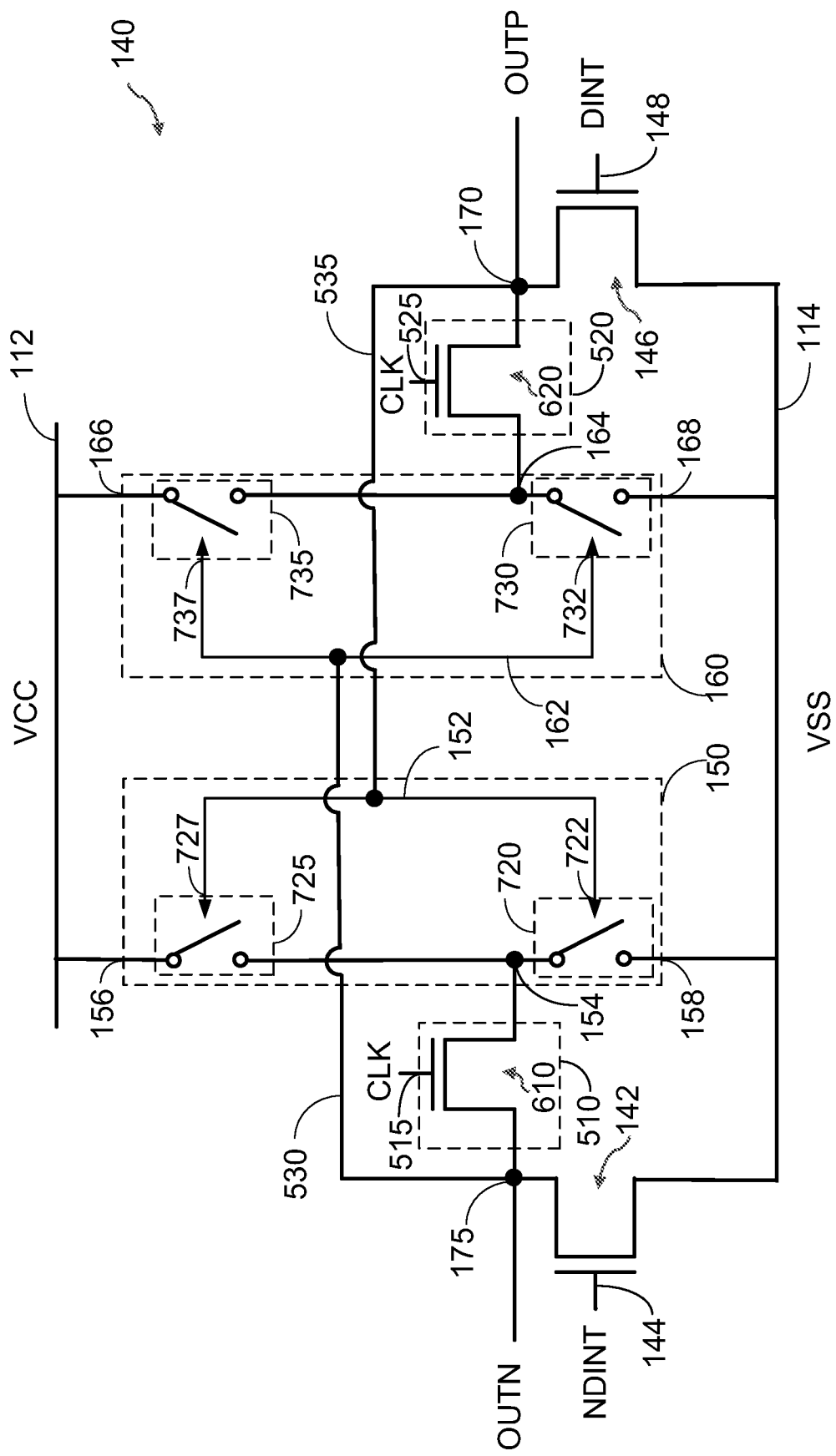
FIG. 7A shows an exemplary implementation of inverting circuits in the regeneration circuit according to certain aspects of the present disclosure.

FIG. 7A shows an exemplary implementation of the first inverting circuit 150 and the second inverting circuit 160 according to certain aspects. In this example, the first inverting circuit 150 includes a first switch 720 and a second switch 725. The first switch 720 is coupled between the output 154 and the second supply terminal 158 of the first inverting circuit 150, and the second switch 725 is coupled between the output 154 and the first supply terminal 156 of the first inverting circuit 150. A control input 722 of the first switch 720 and a control input 727 of the second switch 725 are coupled to the input 152 of the first inverting circuit 150.

In operation, the first switch 720 is configured to turn on and the second switch 725 is configured to turn off when the voltage at the input 152 is high (e.g., approximately VCC). In this case, the first switch 720 pulls the output 154 low. The first switch 720 is configured to turn off and the second switch 725 is configured to turn on when the voltage at the input 152 is low (e.g., approximately ground). In this case, second switch 725 pulls the output 154 high. Each of the switches 720 and 725 may be implemented with one or more transistors, a transmission gate, or another type of switch.

In this example, the second inverting circuit 160 includes a first switch 730 and a second switch 735. The first switch 730 is coupled between the output 164 and the second supply terminal 168 of the second inverting circuit 160, and the second switch 735 is coupled between the output 164 and the first supply terminal 166 of the second inverting circuit 160. A control input 732 of the first switch 730 and a control input 737 of the second switch 735 are coupled to the input 162 of the second inverting circuit 160.

In operation, the first switch 730 is configured to turn on and the second switch 735 is configured to turn off when the voltage at the input 162 is high (e.g., approximately VCC). In this case, the first switch 730 pulls the output 164 low. The first switch 730 is configured to turn off and the second switch 735 is configured to turn on when the voltage at the input 162 is low (i.e., approximately ground). In this case, second switch 735 pulls the output 164 high. Each of the switches 730 and 735 may be implemented with one or more transistors, a transmission gate, or another type of switch.

Figure 7B:
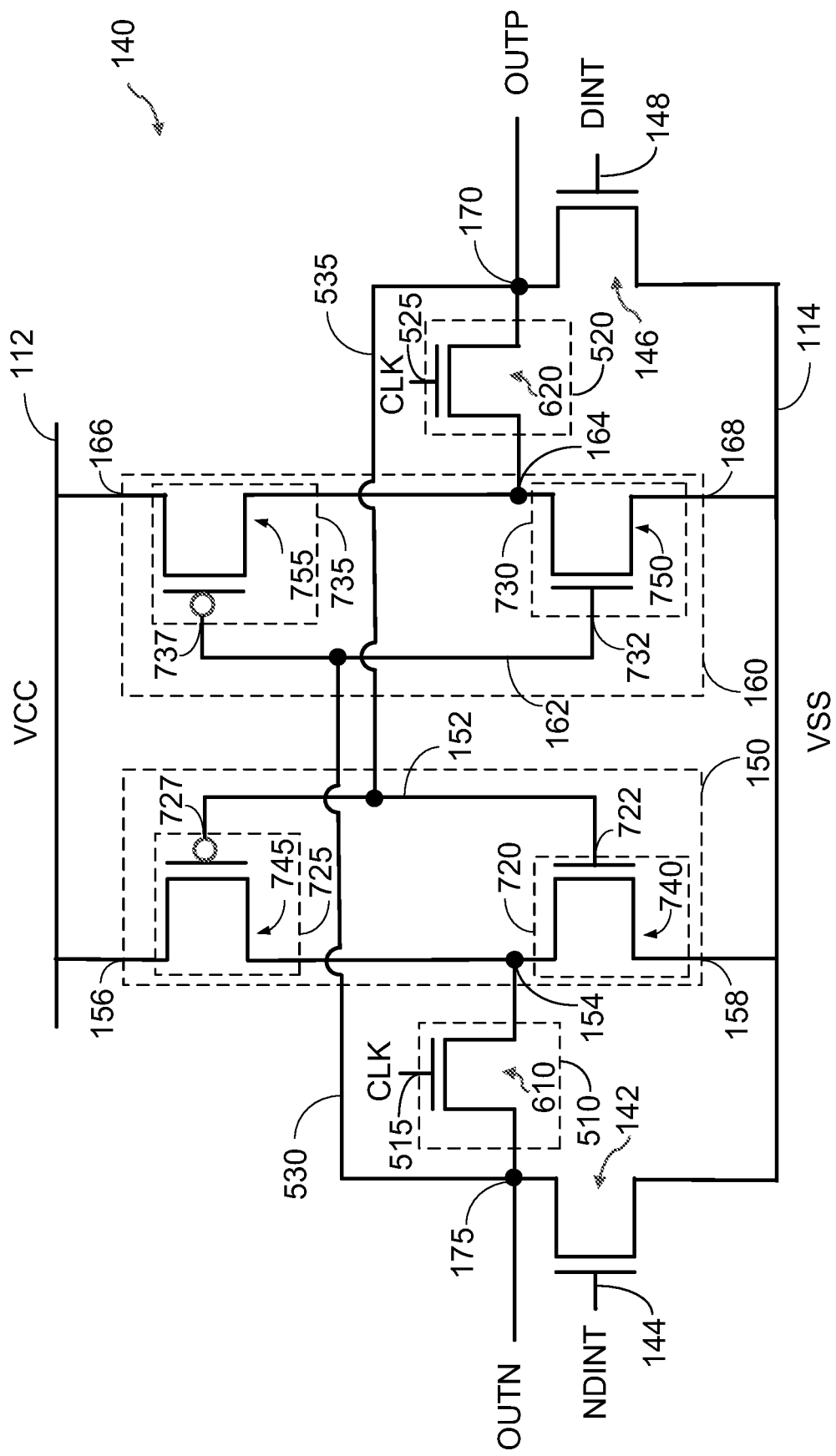
FIG. 7B shows an exemplary implementation of switches in the inverting circuits according to certain aspects of the present disclosure.

FIG. 7B shows an exemplary implementation of the first switch 720 and the second switch 725 in the first inverting circuit 150. In this example, the first switch 720 includes an NFET 740 and the second switch 725 includes a PFET 745. The drain of the NFET 740 is coupled to the output 154, the gate of the NFET 740 is coupled to the control input 722, and the source of the NFET 740 is coupled to the second supply terminal 158. The source of the PFET 745 is coupled to the first supply terminal 156, the drain of the PFET 745 is coupled to the output 154, and the gate of the PFET 745 is coupled to the control input 727.

FIG. 7B also shows an exemplary implementation of the first switch 730 and the second switch 735 in the second inverting circuit 160. In this example, the first switch 730 includes an NFET 750 and the second switch 735 includes a PFET 755. The drain of the NFET 750 is coupled to the output 164, the gate of the NFET 750 is coupled to the control input 732, and the source of the NFET 750 is coupled to the second supply terminal 168. The source of the PFET 755 is coupled to the first supply terminal 166, the drain of the PFET 755 is coupled to the output 164, and the gate of the PFET 755 is coupled to the control input 737.

Figure 7C:
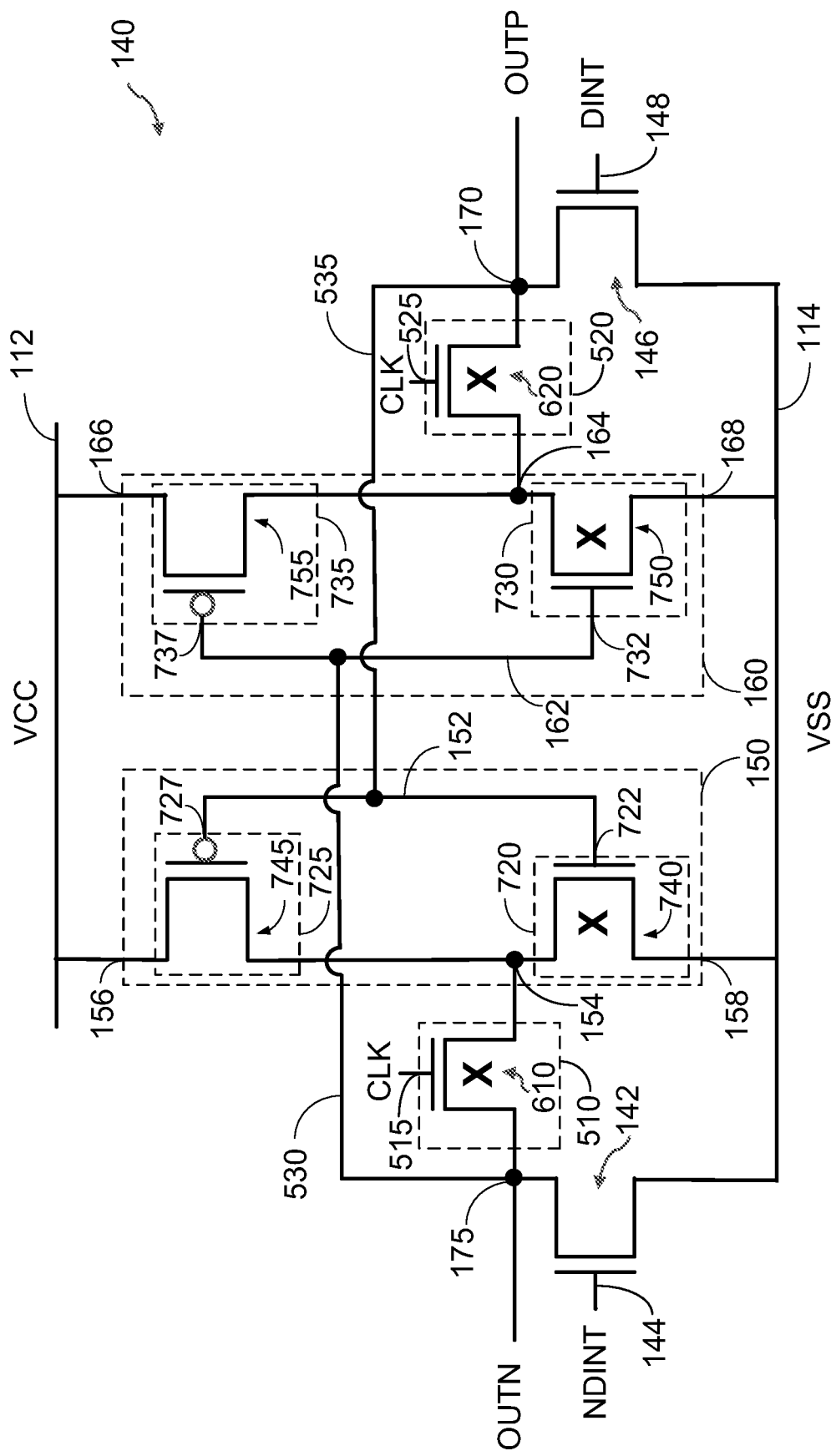
FIG. 7C indicates devices that are turned off in the regeneration circuit during a reset phase according to certain aspects of the present disclosure.

In the examples shown in FIGS. 7A and 7B, the first switch 510 and the second switch 520 disable current paths from the supply rail 112 to the ground 114 during the reset phase. An example of this is illustrated in FIG. 7C, which indicates each of the devices in the regeneration circuit 140 that is turned off during the reset phase with an "X". As shown in FIG. 7C, the first switch 510 and the second switch 520 are turned off. Also, the first switch 720 (e.g., NFET 740) in the first inverting circuit 150 is turned off. This is because the second input transistor 146 pulls the input 152 of the first inverting circuit 150 to the ground 114 during the reset phase, which turns off the first switch 720. The first switch 730 (e.g., NFET 750) in the second inverting circuit 160 is also turned off. This is because the first input transistor 142 pulls the input 162 of the second inverting circuit 160 to the ground 114 during the reset phase, which turns off the first switch 730.

The turning off of the first switch 510 and the first switch 720 in the first inverting circuit 150 prevents current flow from the first supply terminal 156 of the first inverting circuit 150 to the ground 114, and the turning off of the second switch 520 and the first switch 730 in the second inverting circuit 160 prevents current flow from the first supply terminal 166 of the second inverting circuit 160 to the ground 114. As a result, the first switch 510 and the second switch 520 disable current flow from the supply rail 112 to the ground 114 during the reset phase, which reduces power consumption of the regeneration circuit 140 during the reset phase. In contrast, in the example shown in FIGS. 1 and 2, current flow from the supply rail 112 to the ground 114 is disabled during the reset phase by turning off the switch 180, which decouples the inverting circuits 150 and 160 from the supply rail 112.

It is to be appreciated that the inverting circuits 150 and 160 are not limited to the exemplary implementations shown in FIGS. 7A and 7B. Accordingly, it is to be appreciated that each of the inverting circuits 150 and 160 may be implemented with any one of a variety of circuits configured to invert a logic state (i.e., logic level or logic value), and is therefore not limited to a particular implementation.

Figure 8:
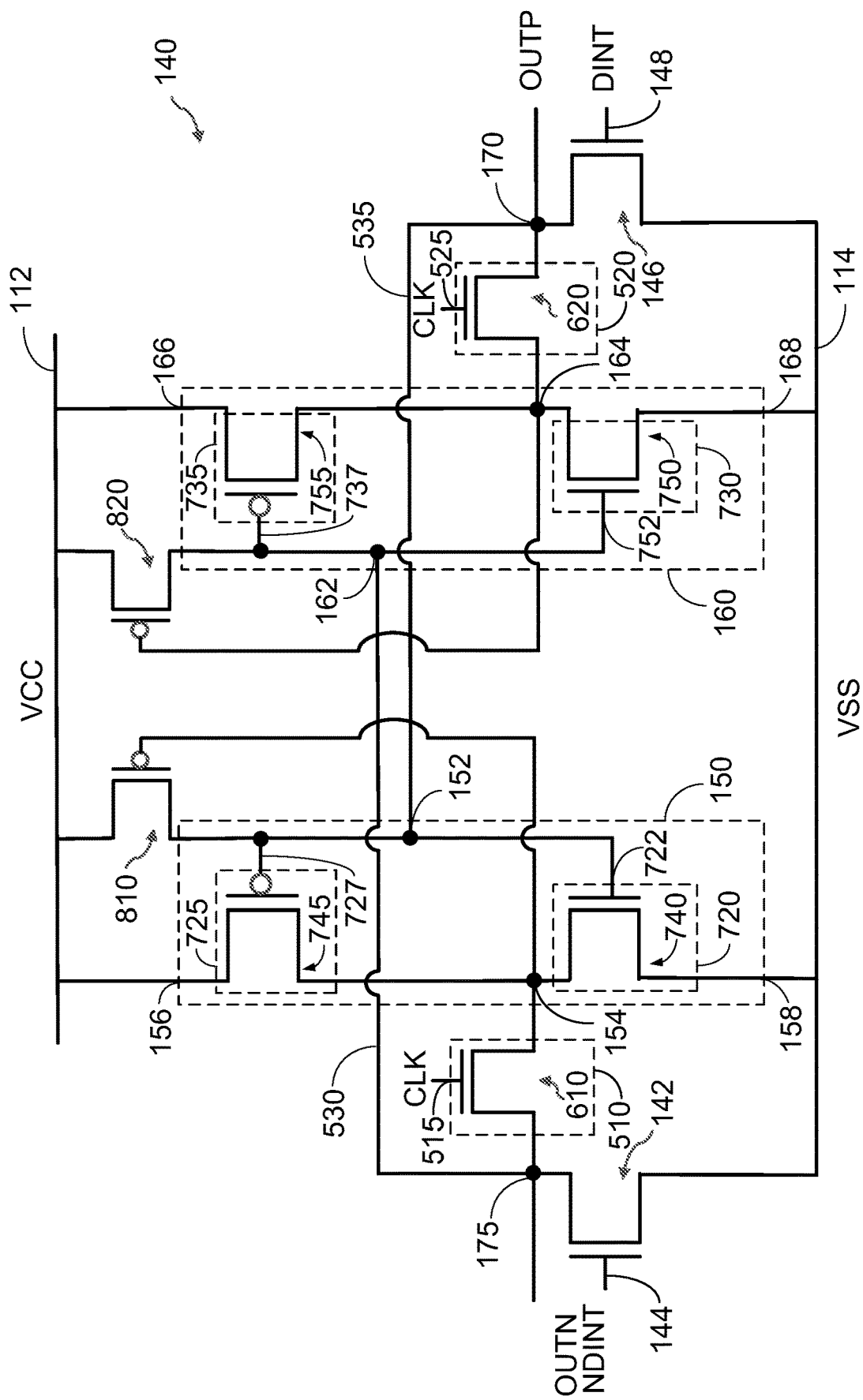
FIG. 8 shows an example of the regeneration circuit including pull-up transistors according to certain aspects of the present disclosure.

FIG. 8 shows an example in which the regeneration circuit 140 further includes a first pull-up transistor 810 and a second pull-up transistor 820 according to certain aspects of the present disclosure. As discussed further below, the first pull-up transistor 810 and the second pull-up transistor 820 boost the regenerative gain of the regeneration circuit 140.

In the example in FIG. 8, the first pull-up transistor 810 is implemented with a first PFET and the second pull-up transistor 820 is implemented with a second PFET. In this example, the source of the first pull-up transistor 810 is coupled to the supply rail 112, the drain of the first pull-up transistor 810 is coupled to the input 152 of the first inverting circuit 150, and the gate of the first pull-up transistor 810 is coupled to the output 154 of the first inverting circuit 150. The source of the second pull-up transistor 820 is coupled to the supply rail 112, the drain of the second pull-up transistor 820 is coupled to the input 162 of the second inverting circuit 160, and the gate of the second pull-up transistor 820 is coupled to the output 164 of the second inverting circuit 160.

When the voltage DINT falls faster than the voltage NDINT during the sensing phase (e.g., INP>INN at the inputs 121 and 123 of the input circuit 115), the second input transistor 146 turns off before the first input transistor 142. This triggers the regenerative feedback of the regeneration circuit 140 to pull up the first output 170 and pull down the second output 175. The pulling down of the second output 175 turns on the first pull-up transistor 810 since the gate of the first pull-up transistor 810 is coupled to the second output 175 through the first switch 510. When the first pull-up transistor 810 turns on, the first pull-up transistor 810 pulls up the input 152 of the first inverting circuit 150 to the supply voltage VCC on the supply rail 112, which helps drive the output 154 of the first inverting circuit 150 low. Since the output 154 of the first inverting circuit 150 is coupled to the second output 175 through the first switch 510, driving the output 154 of the first inverting circuit 150 low helps pull down the second output 175 and hence boost the regenerative gain of the regeneration circuit 140.

When the voltage NDINT falls faster than the voltage DINT during the sensing phase (e.g., INN>INP at the inputs 121 and 123 of the input circuit 115), the first input transistor 142 turns off before the second input transistor 146. This triggers the regenerative feedback of the regeneration circuit 140 to pull up the second output 175 and pull down the first output 170. The pulling down of the first output 170 turns on the second pull-up transistor 820 since the gate of the second pull-up transistor 820 is coupled to the first output 170 through the second switch 520. When the second pull-up transistor 820 turns on, the second pull-up transistor 820 pulls up the input 162 of the second inverting circuit 160 to the supply voltage VCC on the supply rail 112, which helps drive the output 164 of the second inverting circuit 160 low. Since the output 164 of the second inverting circuit 160 is coupled to the first output 170 through the second switch 520, driving the output 164 of the second inverting circuit 160 low helps pull down the first output 170 and hence boost the regenerative gain of the regeneration circuit 140.

Thus, the first pull-up transistor 810 and the second pull-up transistor 820 boost the regenerative gain of the regeneration circuit 140. The first pull-up transistor 810 boosts the regenerative gain for the case where the voltage DINT falls faster than the voltage NDINT during the sensing phase (e.g., INP>INN at the inputs 121 and 123 of the input circuit 115) by pulling up the input 152 of the first inverting circuit 150 to the supply voltage VCC. The second pull-up transistor 820 boosts the regenerative gain for the case where the voltage NDINT falls faster than the voltage DINT during the sensing phase (e.g., INN>INP at the inputs 121 and 123 of the input circuit 115) by pulling up the input 162 of the second inverting circuit 160 to the supply voltage VCC.

Figure 9:
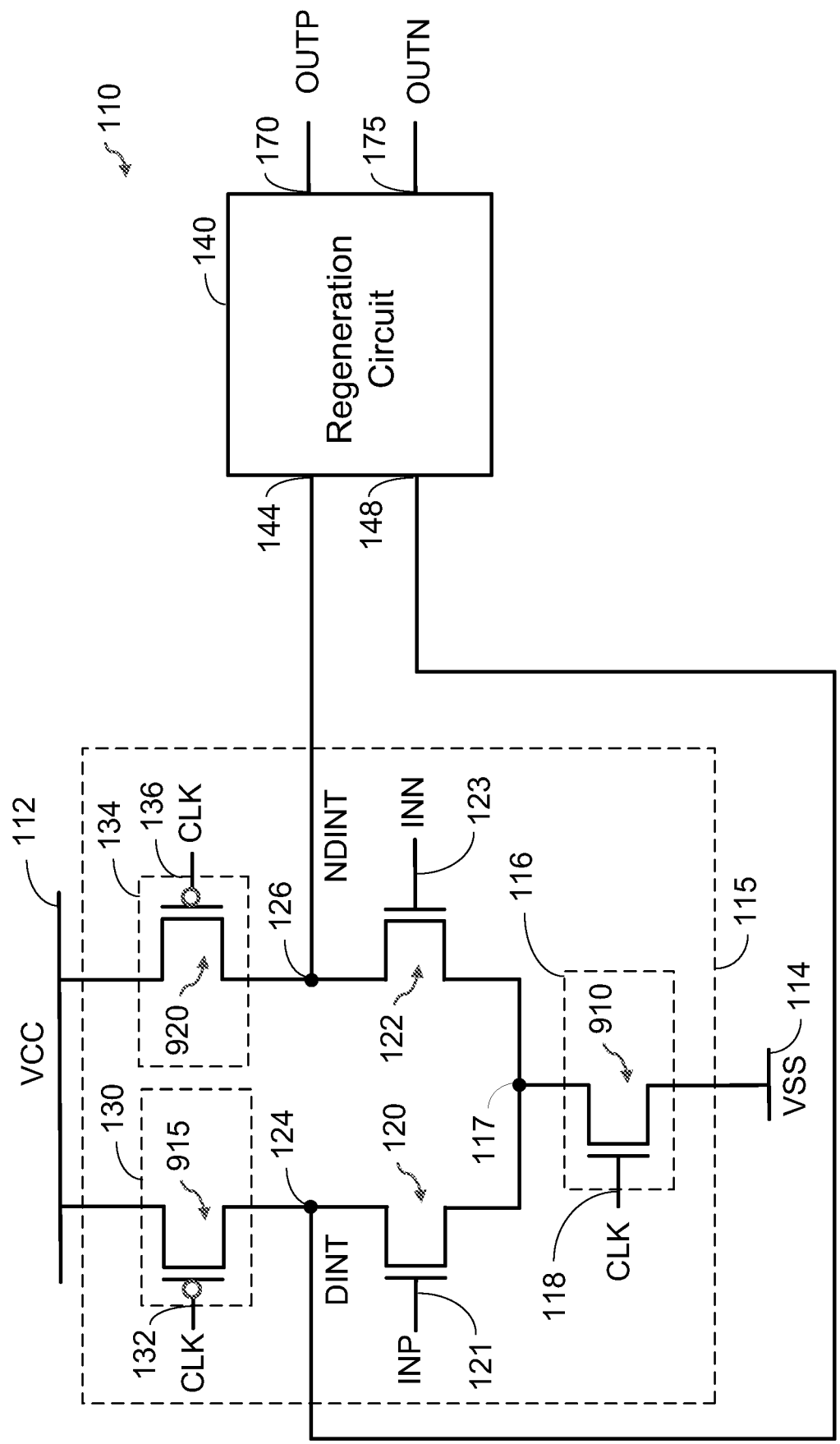
FIG. 9 shows an exemplary implementation of switches in the input circuit according to certain aspects of the present disclosure.

FIG. 9 shows an exemplary implementation of the first switch 116, the second switch 130, and the third switch 134 in the input circuit 115 of the sense amplifier 110 according to certain aspects. Note that details of the regeneration circuit 140 are not shown in FIG. 9 for ease of illustration. As shown in FIG. 9, the first output 124 of the input circuit 115 is coupled to the second input 148 of the regeneration circuit 140, and the second output 126 of the input circuit 115 is coupled to the first input 144 of the regeneration circuit 140. The regeneration circuit 140 may be implemented with any one of the exemplary implementations shown in FIGS. 5 to 8.

In the example in FIG. 9, the first switch 116 is implemented with an NFET 910 in which the drain of the NFET 910 is coupled to the sources of the input transistors 120 and 122, the gate of the NFET 910 is coupled to the control input 118, and the source of the NFET 910 is coupled to the ground. The second switch 130 is implemented with a first PFET 915 in which the source of the first PFET 915 is coupled to the supply rail 112, the gate of the first PFET 915 is coupled to the control input 132, and the drain of the first PFET 915 is coupled to the drain of the first input transistor 120. The third switch 134 is implemented with a second PFET 920 in which the source of the second PFET 920 is coupled to the supply rail 112, the gate of the second PFET 920 is coupled to the control input 136, and the drain of the second PFET 920 is coupled to the drain of the second input transistor 122.

The first switch 116, the second switch 130, and the third switch 134 in the input circuit 115 may be driven by the same timing signal (e.g., the clock signal CLK) as the first switch 510 and the second switch 520 in the regeneration circuit 140. In this example, the first switch 116 is turned off, and the second switch 130 and the third switch 134 are turned on when the timing signal is low. The first switch 116 is turned on, and the second switch 130 and the third switch 134 are turned off when the timing signal is high. In this example, the timing signal is low during the reset phase and is high during the sensing phase and the decision phase.

Figure 10:
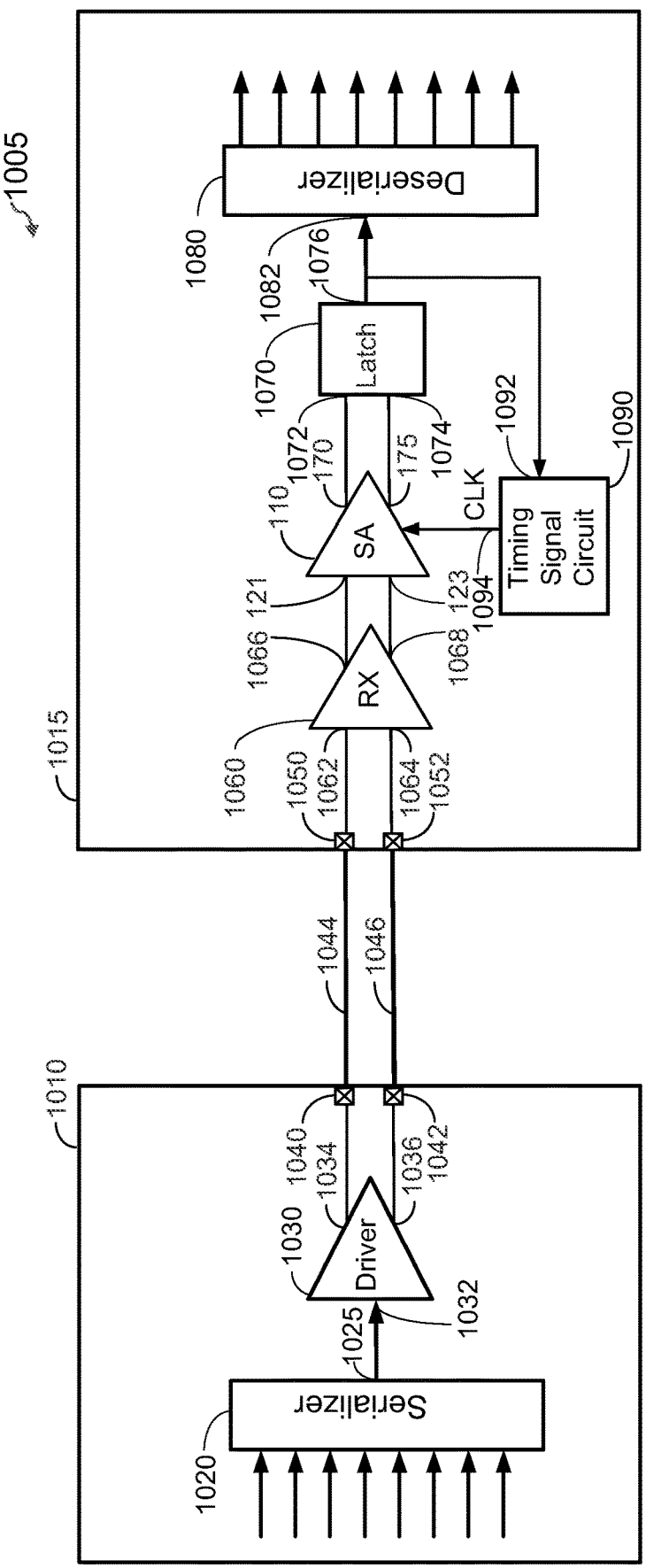
FIG. 10 shows an example of a system in which aspects of the present disclosure may be used according to certain aspects of the present disclosure.

FIG. 10 shows an example of a system 1005 in which aspects of the present disclosure may be used. In this example, the system 1005 includes a first chip 1010 and a second chip 1015 in which SerDes may be used for communication between the first chip 1010 and the second chip 1015. The first chip 1010 includes a serializer 1020, a driver 1030, a first output pin 1040, and a second output pin 1042. The second chip 1015 includes a first receive pin 1050, a second receive pin 1052, a receiver 1060, the sense amplifier 110, a latch 1070, and a deserializer 1080.

In this example, the first chip 1010 and the second chip 1015 are coupled via a differential serial link including a first line 1044 and a second line 1046. The first line 1044 is coupled between the first output pin 1040 and the first receive pin 1050, and the second line 1046 is coupled between the second output pin 1042 and the second receive pin 1052. Each line 1044 and 1046 may be implemented with a metal line on a substrate (e.g., a printed circuit board), a wire, etc.

On the first chip 1010, the serializer 1020 is configured to receive parallel data streams (e.g., from a processor on the first chip 1010) and convert the parallel data streams into a serial data stream, which is output at an output 1025 of the serializer 1020. The driver 1030 has an input 1032 coupled to the output 1025 of the serializer 1020, a first output 1034 coupled to the first output pin 1040, and a second output 1036 coupled to the second output pin 1042. The driver 1030 is configured to receive the serial data stream, convert the serial data stream into a differential signal, and drive the lines 1044 and 1046 of the differential seral link with the differential data signal to transmit the differential signal to the second chip 1015. It is to be appreciated that the first chip 1010 may include additional components not shown in FIG. 10 (e.g., impedance matching network coupled to the output pins 1040 and 1042, a pre-driver coupled between the serializer 1020 and the driver 1030, etc.).

On the second chip 1015, the receiver 1060 has a first input 1062 coupled to the first receive pin 1050, a second input 1064 coupled to the second receive pin 1052, a first output 1066 coupled to the first input 121 of the sense amplifier 110, and a second output 1068 coupled to the second input 123 of the sense amplifier 110. The receiver 1060 may include at least one of an amplifier and an equalizer (e.g., to compensate for frequency-dependent signal attenuation between the first chip 1010 and the second chip 1015). The sense amplifier 110 receives the differential signal from the receiver 1060 and makes bit decisions based on the differential signal, as discussed above.

In the example in FIG. 10, the first output 170 of the sense amplifier 110 is coupled to a first input 1072 of the latch 1070, and the second output 175 of the sense amplifier 110 is coupled to a second input 1074 of the latch 1070. The latch 1070 has an output 1076 coupled to an input 1082 of the deserializer 1080. The latch 1070 is configured to latch bit decisions from the sense amplifier 110 and output the corresponding bits to the deserializer 1080. The deserializer 1080 is configured to convert the bits into parallel data streams, which may be output to one or more components (not shown) on the second chip 1015 for further processing. It is to be appreciated that the second chip 1015 may include additional components not shown in FIG. 10 (e.g., impedance matching network coupled to the receive pins 1050 and 1052, a clock recovery circuit, etc.).

In the example in FIG. 10, the second chip 1015 also includes a timing signal circuit 1090 configured to generate the timing signal (e.g., clock signal CLK) for the sense amplifier 110 and output the timing signal at output 1094. The output 1094 may be coupled to the control inputs of the switches 116, 130 and 134 in the input circuit 115 and the control inputs of the switches 510 and 520 in the regeneration circuit 140 of the sense amplifier 110.

In certain aspects, the timing signal circuit 1090 may recover the timing signal (e.g., clock signal CLK) based on the bit decisions of the sense amplifier 110 using clock data recovery. The input 1092 of the timing signal circuit 1090 may be coupled to the output of the latch 1070 (shown in the example in FIG. 10) or may be coupled to one or both outputs 170 and 175 of the sense amplifier 110 to receive the bit decisions.

In certain aspects, the timing signal circuit 1090 may include a clock generator which may include a phase locked loop (PLL), a delay locked loop (DLL), an oscillator, or any combination thereof to generate the timing signal (e.g., clock signal CLK). It is to be appreciated that the timing signal circuit 1090 may be implemented using various types of clock generators.

In the example in FIG. 10, the first input 1072 of the latch 1070 is coupled to the first output 170 and hence the drain of the second input transistor 146, and the second input 1074 of the latch 1070 is coupled to the second output 175 and hence the drain of the first input transistor 142. However, it is to be appreciated that the present disclosure is not limited to this example. In another example, the first input 1072 of the latch 1070 may be coupled to the output 164 of the second inverting circuit 160, and the second input 1074 of the latch 1070 may be coupled to the output 154 of the first inverting circuit 150.

Figure 11:
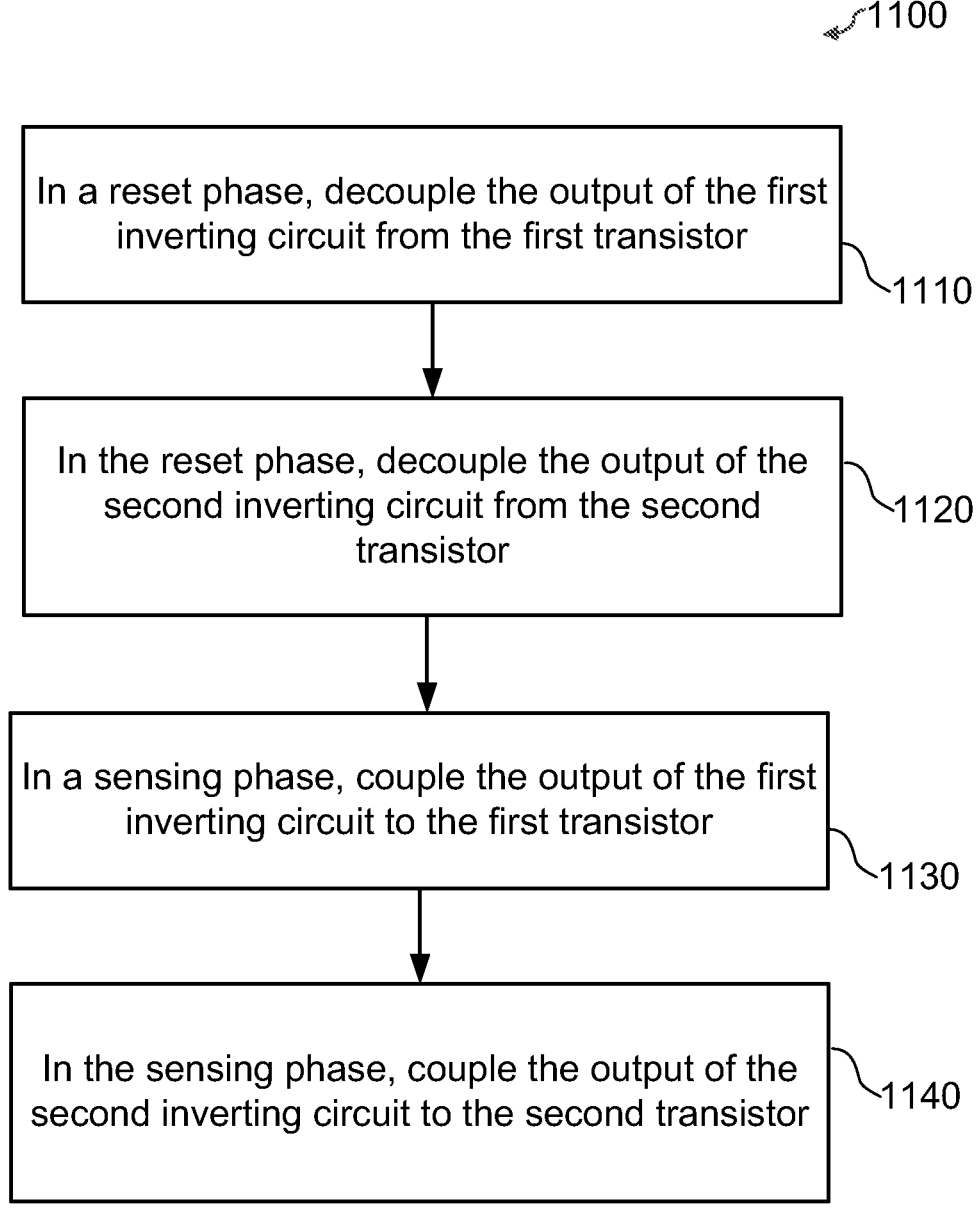
FIG. 11 is a flowchart illustrating an exemplary method for operating a regeneration circuit of a sense amplifier according to certain aspects of the present disclosure.

FIG. 11 illustrates a method 1100 of operating a regeneration circuit of a sense amplifier according to certain aspects. The regeneration circuit (e.g., regeneration circuit 140) includes a first inverting circuit (e.g., first inverting circuit 150) having an input (e.g., input 152) and an output (e.g., output 154), a second inverting circuit (e.g., second inverting circuit 160) having an input (e.g., input 162) and an output (e.g., output 164), a first transistor (e.g., first input transistor 142) coupled to the input of the second inverting circuit, and a second transistor (e.g., second input transistor 146) coupled to the input of the first inverting circuit.

At block 1110, in a reset phase, the output of the first inverting circuit is decoupled from the first transistor. For example, the output of the first inverting circuit may be decoupled from the first transistor by turning off the first switch 510.

At block 1120, in the reset phase, the output of the second inverting circuit is decoupled from the second transistor. For example, the output of the second inverting circuit may be decoupled from the second transistor by turning off the second switch 520.

At block 1130, in a sensing phase, the output of the first inverting circuit is coupled to the first transistor. For example, the output of the first inverting circuit may be coupled to the first transistor by turning on the first switch 510.

At block 1140, in the sensing phase, the output of the second inverting circuit is coupled to the second transistor. For example, the output of the second inverting circuit may be coupled to the second transistor by turning on the second switch 520.

In certain aspects, the method 1100 may also include driving a gate of the first transistor with a first input signal (e.g., voltage NDINT) and driving a gate of the second transistor with a second input signal (e.g., voltage DINT). The first input signal and the second input signal may be generated by the input circuit 115 based on a data signal (e.g., a differential data signal) input to the input circuit 115.

In certain aspects, in the reset phase, the first input signal is above a threshold voltage of the first transistor, and the second input signal is above a threshold voltage of the second transistor. In one example, the threshold voltage of the first transistor may be approximately the same as the threshold voltage of the second transistor.

In certain aspects, in the sensing phase, the first input signal is above the threshold voltage of the first transistor, and the second input signal is above the threshold voltage of the second transistor. In certain aspects, in the sensing phase, the first input signal (e.g., voltage NDINT) falls (i.e., decreases) at a first rate and the second input signal (e.g., voltage DINT) falls (i.e., decreases) at a second rate, wherein the first rate and the second rate are different (e.g., based on the polarity of the data signal input to the input circuit 115).

The method 1100 may also include transitioning from the sensing phase to a decision phase when the first input signal falls below the threshold voltage of the first transistor or the second input signal falls below the threshold voltage of the second transistor. The method 1100 may also include, in the decision phase, resolving a bit value based on the first input signal and the second input signal. For example, resolving the bit value may include resolving to a first bit value if the first input signal falls below the threshold voltage of the first transistor before the second input signal falls below the threshold voltage of the second transistor, and resolving to a second bit value if the second input signal falls below the threshold voltage of the second transistor before the first input signal falls below the threshold voltage of the first transistor. The first bit value may be a one and the second bit value may be a zero, or vice versa. In certain aspects, in the decision phase, the output of the first inverting circuit is coupled to the first transistor and the output of the second inverting circuit is coupled to the second transistor, which cross couples the first inverting circuit and the second inverting circuit. This is because the first transistor is coupled to the input of the second inverting circuit and the second transistor is coupled to the input of the first inverting circuit. The cross coupling of the first inverting circuit and the second inverting circuit provides regenerative feedback, which facilitates resolving the bit value.

Implementation examples are described in the following numbered clauses:

1. A regeneration circuit, comprising:
    a first inverting circuit having an input and an output;
    a second inverting circuit having an input and an output;
    a first transistor coupled to the input of the second inverting circuit, wherein a gate of the first transistor is configured to receive a first input signal;
    a second transistor coupled to the input of the first inverting circuit, wherein a gate of the second transistor is configured to receive a second input signal;
    a first switch coupled between the first transistor and the output of the first inverting circuit, wherein a control input of the first switch is configured to receive a timing signal; and
    a second switch coupled between the second transistor and the output of the second inverting circuit, wherein a control input of the second switch is configured to receive the timing signal.
2. The regeneration circuit of clause 1, wherein:
    the first switch is coupled between a drain of the first transistor and the output of the first inverting circuit; and
    the second switch is coupled between a drain of the second transistor and the output of the second inverting circuit.
3. The regeneration circuit of clause 2, wherein:
    a source of the first transistor is coupled to a ground; and
    a source of the second transistor is coupled to the ground.
4. The regeneration circuit of clause 2 or 3, wherein the first transistor comprises a first n-type field effect transistor (NFET) and the second transistor comprises a second NFET.
5. The regeneration circuit any one of clauses 2 to 4, wherein:
    the drain of the first transistor is directly coupled to the input of the second inverting circuit; and
    the drain of the second transistor is directly coupled to the input of the first inverting circuit.
6. The regeneration circuit of any one of clauses 1 to 5, wherein:
    the first switch comprises a third transistor having a gate configured to receive the timing signal; and
    the second switch comprises a fourth transistor having a gate configured to receive the timing signal.
7. The regeneration circuit of clause 6, wherein:
    one of a source and a drain of the third transistor is coupled to a drain of the first transistor, and the other one of the source and the drain of the third transistor is coupled to the output of the first inverting circuit; and
    one of a source and a drain of the fourth transistor is coupled to a drain of the second transistor, and the other one of the source and the drain of the fourth transistor is coupled to the output of the second inverting circuit.
8. The regeneration circuit of clause 6 or 7, wherein:
    the third transistor comprises a first n-type field effect transistor (NFET); and
    the fourth transistor comprises a second NFET.
9. The regeneration circuit of any one of clauses 1 to 5, further comprising:
    a third transistor coupled between the input of the first inverting circuit and a supply rail; and
    a fourth transistor coupled between the input of the second inverting circuit and the supply rail.
10. The regeneration circuit of clause 9, wherein:
    a gate of the third transistor is coupled to the output of the first inverting circuit; and
    a gate of the fourth transistor is coupled to the output of the second inverting circuit.
11. The regeneration circuit of clause 9 or 10, wherein:
    a source of the third transistor is coupled to the supply rail and a drain of the third transistor is coupled to the input of the first inverting circuit; and
    a source of the fourth transistor is coupled to the supply rain and a drain of the fourth transistor is coupled to the input of the second inverting circuit.
12. The regeneration circuit of any one of clauses 9 to 11, wherein:
    the third transistor comprises a first p-type field effect transistor (PFET); and
    the fourth transistor comprises a second PFET.
13. The regeneration circuit of any one of clauses 1 to 12, wherein the timing signal comprises a clock signal.
14. The regeneration circuit of any one of clauses 1 to 13, wherein the control input of the first switch and the control input of the second switch are coupled to a timing signal circuit configured to generate the timing signal.
15. A sense amplifier, comprising:
    an input circuit, wherein the input circuit comprises:
        a first transistor, wherein a gate of the first transistor is configured to receive a first input signal, and a drain of the first transistor is coupled to a first output of the input circuit; and
        a second transistor, wherein a gate of the second transistor is configured to receive a second input signal, and a drain of the second transistor is coupled to a second output of the input circuit; and
    a regeneration circuit, wherein the regeneration circuit comprises:
        a first inverting circuit having an input and an output;
        a second inverting circuit having an input and an output;
        a third transistor coupled to the input of the second inverting circuit, wherein a gate of the third transistor is coupled to the second output of the input circuit;
        a fourth transistor coupled to the input of the first inverting circuit, wherein a gate of the fourth transistor is coupled to the first output of the input circuit;
        a first switch coupled between the third transistor and the output of the first inverting circuit, wherein a control input of the first switch is configured to receive a timing signal; and
        a second switch coupled between the fourth transistor and the output of the second inverting circuit, wherein a control input of the second switch is configured to receive the timing signal.
16. The sense amplifier of clause 15, wherein the input circuit further comprises:
    a third switch coupled between the drain of the first transistor and a supply rail; and
    a fourth switch coupled between the drain of the second transistor and the supply rail.
17. The sense amplifier of clause 16, wherein:
    a control input of the third switch is configured to receive the timing signal; and a control input of the fourth switch is configured to receive the timing signal.
18. The sense amplifier of clause 16 or 17, wherein the input circuit further comprises a fifth switch coupled between a source of the first transistor and a ground, and coupled between a source of the second transistor and the ground.
19. The sense amplifier of clause 18, wherein:
a control input of the third switch is configured to receive the timing signal;
a control input of the fourth switch is configured to receive the timing signal; and
a control input of the fifth switch is configured to receive the timing signal.
20. The sense amplifier of any one of clauses 15 to 19, wherein:
the first switch is coupled between a drain of the third transistor and the output of the first inverting circuit; and
the second switch is coupled between a drain of the fourth transistor and the output of the second inverting circuit.
21. The sense amplifier of clause 20, wherein:
a source of the third transistor is coupled to a ground; and
a source of the fourth transistor is coupled to the ground.
22. The sense amplifier of clause 20 or 21, wherein:
the drain of the third transistor is directly coupled to the input of the second inverting circuit; and
the drain of the fourth transistor is directly coupled to the input of the first inverting circuit.
23. The sense amplifier of any one of clauses 15 to 22, wherein:
the first switch comprises a fifth transistor having a gate configured to receive the timing signal; and
the second switch comprises a sixth transistor having a gate configured to receive the timing signal.
24. The regeneration circuit of clause 23, wherein:
one of a source and a drain of the fifth transistor is coupled to a drain of the third transistor, and the other one of the source and the drain of the fifth transistor is coupled to the output of the first inverting circuit; and
one of a source and a drain of the sixth transistor is coupled to a drain of the fourth transistor, and the other one of the source and the drain of the sixth transistor is coupled to the output of the second inverting circuit.
25. A method of operating a regeneration circuit of a sense amplifier, wherein the regeneration circuit includes a first inverting circuit having an input and an output, a second inverting circuit having an input and an output, a first transistor coupled to the input of the second inverting circuit, and a second transistor coupled to the input of the first inverting circuit, the method comprising:
in a reset phase,
decoupling the output of the first inverting circuit from the first transistor; and
decoupling the output of the second inverting circuit from the second transistor; and
in a sensing phase,
coupling the output of the first inverting circuit to the first transistor; and
coupling the output of the second inverting circuit to the second transistor.
26. The method of clause 25, further comprising:
driving a gate of the first transistor with a first input signal; and
driving a gate of the second transistor with a second input signal.
27. The method of clause 26, wherein:
in the reset phase, the first input signal is above a threshold voltage of the first transistor, and the second input signal is above a threshold voltage of the second transistor.
28. The method of clause 27, wherein:
in the sensing phase, the first input signal is above the threshold voltage of the first transistor, and the second input signal is above the threshold voltage of the second transistor.
29. The method of clause 28, wherein:
in the sensing phase, the first input signal falls at a first rate, the second input signal falls at a second rate, and the first rate and the second rate are different.
30. The method of clause 29, further comprising:
transitioning from the sensing phase to a decision phase when the first input signal falls below the threshold voltage of the first transistor or the second input signal falls below the threshold voltage of the second transistor.
31. The method of clause 30, further comprising:
in the decision phase, resolving a bit value based on the first input signal and the second input signal.
32. The method of any one of clauses 25 to 31, wherein the regeneration circuit includes a first switch coupled between the output of the first inverting circuit and the first transistor, and a second switch coupled between the output of the second inverting circuit and the second transistor, and wherein:
decoupling the output of the first inverting circuit from the first transistor comprises turning off the first switch;
decoupling the output of the second inverting circuit from the second transistor comprises turning off the second switch;
coupling the output of the first inverting circuit to the first transistor comprises turning on the first switch; and
coupling the output of the second inverting circuit to the second transistor comprises turning on the second switch.
33. The method of any one of clauses 25 to 32, wherein a drain of the first transistor is directly coupled to the input of the second inverting circuit, and a drain of the second transistor is directly coupled to the input of the first inverting circuit.
34. The method of clause 33, wherein:
decoupling the output of the first inverting circuit from the first transistor comprises decoupling the output of the first inverting circuit from the drain of the first transistor;
decoupling the output of the second inverting circuit from the second transistor comprises decoupling the output of the second inverting circuit from the drain of the second transistor;
coupling the output of the first inverting circuit to the first transistor comprises coupling the output of the first inverting circuit to the drain of the first transistor; and coupling the output of the second inverting circuit to the second transistor comprises coupling the output of the second inverting circuit to the drain of the second transistor.

35. The method of clause 34, wherein the regeneration circuit includes a first switch coupled between the output of the first inverting circuit and the drain of the first transistor, and a second switch coupled between the output of the second inverting circuit and the drain of the second transistor, and wherein:
decoupling the output of the first inverting circuit from the drain of the first transistor comprises turning off the first switch;
decoupling the output of the second inverting circuit from the drain of the second transistor comprises turning off the second switch;
coupling the output of the first inverting circuit to the drain of the first transistor comprises turning on the first switch; and
coupling the output of the second inverting circuit to the drain of the second transistor comprises turning on the second switch.

36. A system, comprising:
a sense amplifier, comprising:
an input circuit, wherein the input circuit comprises:
a first transistor, wherein a gate of the first transistor is configured to receive a first input signal, and a drain of the first transistor is coupled to a first output of the input circuit; and
a second transistor, wherein a gate of the second transistor is configured to receive a second input signal, and a drain of the second transistor is coupled to a second output of the input circuit; and
a regeneration circuit, wherein the regeneration circuit comprises:
a first inverting circuit having an input and an output;
a second inverting circuit having an input and an output;
a third transistor coupled to the input of the second inverting circuit, wherein a gate of the third transistor is coupled to the second output of the input circuit;
a fourth transistor coupled to the input of the first inverting circuit, wherein a gate of the fourth transistor is coupled to the first output of the input circuit;
a first switch coupled between the third transistor and the output of the first inverting circuit, wherein a control input of the first switch is configured to receive a timing signal; and
a second switch coupled between the fourth transistor and the output of the second inverting circuit, wherein a control input of the second switch is configured to receive the timing signal;
a latch having an input and an output, wherein the input of the latch is coupled to the sense amplifier; and
a deserializer having an input coupled to the output of the latch.

37. The system of clause 36, further comprising:
a serializer having an output;
a driver having an input and output, wherein the input of the driver is coupled to the output of the serializer; and a receiver having an input and an output, wherein the input of the receiver is coupled to the output of the driver, and the output of the receive is coupled to the sense amplifier.

38. The system of clause 37, wherein the output of the receiver comprises:
a first output coupled to the gate of the first transistor; and
a second output coupled to the gate of the second transistor.

39. The system of any one of clauses 36 to 38, wherein the input of the latch comprises:
a first input coupled to a drain of the fourth transistor or the output of the second inverting circuit; and
a second input coupled to a drain of the third transistor or the output of the first inverting circuit.

It is to be appreciated that the present disclosure is not limited to the exemplary terminology used above to describe aspects of the present disclosure. For example, the input circuit 115 may also be referred to as a sensing circuit or another term. The regeneration circuit 140 may also be referred to as a decision circuit, a cross-coupled latch, or another term. An inverting circuit may also be referred to as an inverter, an inverting circuit, or another term. A logic state may also be referred to as a logic level, a logic value, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A regeneration circuit, comprising:
a first inverting circuit having an input and an output;
a second inverting circuit having an input and an output;
a first transistor coupled to the input of the second inverting circuit, wherein a gate of the first transistor is configured to receive a first input signal;
a second transistor coupled to the input of the first inverting circuit, wherein a gate of the second transistor is configured to receive a second input signal;
a first switch coupled between the first transistor and the output of the first inverting circuit, wherein a control input of the first switch is configured to receive a timing signal, and the first switch is configured to decouple the output of the first inverting circuit from the input of the second inverting circuit when the timing signal turns off the first switch;
a second switch coupled between the second transistor and the output of the second inverting circuit, wherein a control input of the second switch is configured to receive the timing signal, and the second switch is configured to decouple the output of the second inverting circuit from the input of the first inverting circuit when the timing signal turns off the second switch;
a third transistor coupled between the input of the first inverting circuit and a supply rail, wherein a gate of the third transistor is coupled to the output of the first inverting circuit; and
a fourth transistor coupled between the input of the second inverting circuit and the supply rail, wherein a gate of the fourth transistor is coupled to the output of the second inverting circuit.

2. The regeneration circuit of claim 1, wherein:
the first switch is coupled between a drain of the first transistor and the output of the first inverting circuit; and
the second switch is coupled between a drain of the second transistor and the output of the second inverting circuit.

3. The regeneration circuit of claim 2, wherein:
a source of the first transistor is coupled to a ground; and
a source of the second transistor is coupled to the ground.

4. The regeneration circuit of claim 2, wherein the first transistor comprises a first n-type field effect transistor (NFET) and the second transistor comprises a second NFET.

5. A regeneration circuit, comprising:
a first inverting circuit having an input and an output;
a second inverting circuit having an input and an output;
a first transistor coupled to the input of the second inverting circuit, wherein a gate of the first transistor is configured to receive a first input signal, and a drain of the first transistor is directly coupled to the input of the second inverting circuit;
a second transistor coupled to the input of the first inverting circuit, wherein a gate of the second transistor is configured to receive a second input signal, and a drain of the second transistor is directly coupled to the input of the first inverting circuit;
a first switch coupled between the drain of the first transistor and the output of the first inverting circuit, wherein a control input of the first switch is configured to receive a timing signal;
a second switch coupled between the drain of the second transistor and the output of the second inverting circuit, wherein a control input of the second switch is configured to receive the timing signal;
a third transistor coupled between the input of the first inverting circuit and a supply rail, wherein a gate of the third transistor is coupled to the output of the first inverting circuit; and
a fourth transistor coupled between the input of the second inverting circuit and the supply rail, wherein a gate of the fourth transistor is coupled to the output of the second inverting circuit.

6. The regeneration circuit of claim 1, wherein:
the first switch comprises a fifth transistor having a gate configured to receive the timing signal; and
the second switch comprises a sixth transistor having a gate configured to receive the timing signal.

7. The regeneration circuit of claim 6, wherein:
one of a source and a drain of the fifth transistor is coupled to a drain of the first transistor, and the other one of the source and the drain of the fifth transistor is coupled to the output of the first inverting circuit; and
one of a source and a drain of the sixth transistor is coupled to a drain of the second transistor, and the other one of the source and the drain of the sixth transistor is coupled to the output of the second inverting circuit.

8. The regeneration circuit of claim 6, wherein:
the fifth transistor comprises a first n-type field effect transistor (NFET); and
the sixth transistor comprises a second NFET.

9. The regeneration circuit of claim 1, wherein:
a source of the third transistor is coupled to the supply rail and a drain of the third transistor is coupled to the input of the first inverting circuit; and
a source of the fourth transistor is coupled to the supply rain and a drain of the fourth transistor is coupled to the input of the second inverting circuit.

10. The regeneration circuit of claim 1, wherein:
the third transistor comprises a first p-type field effect transistor (PFET); and
the fourth transistor comprises a second PFET.

11. The regeneration circuit of claim 1, wherein the timing signal comprises a clock signal.

12. The regeneration circuit of claim 1, wherein the control input of the first switch and the control input of the second switch are coupled to a timing signal circuit configured to generate the timing signal.

13. A sense amplifier, comprising:
an input circuit, wherein the input circuit comprises:
a first transistor, wherein a gate of the first transistor is configured to receive a first input signal, and a drain of the first transistor is coupled to a first output of the input circuit;
a second transistor, wherein a gate of the second transistor is configured to receive a second input signal, and a drain of the second transistor is coupled to a second output of the input circuit;
a first switch coupled between the drain of the first transistor and a supply rail; and
a second switch coupled between the drain of the second transistor and the supply rail;
a regeneration circuit, wherein the regeneration circuit comprises:
a first inverting circuit having an input and an output;
a second inverting circuit having an input and an output;
a third transistor coupled to the input of the second inverting circuit, wherein a gate of the third transistor is coupled to the second output of the input circuit;
a fourth transistor coupled to the input of the first inverting circuit, wherein a gate of the fourth transistor is coupled to the first output of the input circuit;
a third switch coupled between the third transistor and the output of the first inverting circuit, wherein the third switch is configured to decouple the output of the first inverting circuit from the input of the second inverting circuit when the third switch is turned off; and
a fourth switch coupled between the fourth transistor and the output of the second inverting circuit, wherein the fourth switch is configured to decouple the output of the second inverting circuit from the input of the first inverting signal circuit when the fourth switch is turned off; and a timing signal circuit coupled to the first switch, the second switch, the third switch, and the fourth switch, wherein:

in a reset phase, the timing signal circuit is configured to turn on the first switch, turn on the second switch, turn off the third switch, and turn off the fourth switch; and in a sensing phase, the timing signal circuit is configured to turn off the first switch, turn off the second switch, turn on the third switch, and turn on the fourth switch.

14. The sense amplifier of claim 13, wherein the input circuit further comprises a fifth switch coupled between a source of the first transistor and a ground, and coupled between a source of the second transistor and the ground.

15. The sense amplifier of claim 14, wherein the timing signal circuit is configured to turn off the fifth switch in the reset phase and turn on the fifth switch in the sensing phase.

16. The sense amplifier of claim 13, wherein:
the third switch is coupled between a drain of the third transistor and the output of the first inverting circuit; and
the fourth switch is coupled between a drain of the fourth transistor and the output of the second inverting circuit.

17. The sense amplifier of claim 16, wherein:
a source of the third transistor is coupled to a ground; and
a source of the fourth transistor is coupled to the ground.

18. A sense amplifier, comprising:
an input circuit, wherein the input circuit comprises:
a first transistor, wherein a gate of the first transistor is configured to receive a first input signal, and a drain of the first transistor is coupled to a first output of the input circuit;
a second transistor, wherein a gate of the second transistor is configured to receive a second input signal, and a drain of the second transistor is coupled to a second output of the input circuit;
a first switch coupled between the drain of the first transistor and a supply rail; and
a second switch coupled between the drain of the second transistor and the supply rail;
a regeneration circuit, wherein the regeneration circuit comprises:
a first inverting circuit having an input and an output;
a second inverting circuit having an input and an output;
a third transistor coupled to the input of the second inverting circuit, wherein a gate of the third transistor is coupled to the second output of the input circuit, and a drain of the third transistor is directly coupled to the input of the second inverting circuit;
a fourth transistor coupled to the input of the first inverting circuit, wherein a gate of the fourth transistor is coupled to the first output of the input circuit, and a drain of the fourth transistor is directly coupled to the input of the first inverting circuit;
a third switch coupled between the drain of the third transistor and the output of the first inverting circuit;
a fourth switch coupled between the drain of the fourth transistor and the output of the second inverting circuit; and
a timing signal circuit coupled to the first switch, the second switch, the third switch, and the fourth switch, wherein:

in a reset phase, the timing signal circuit is configured to turn on the first switch, turn on the second switch, turn off the third switch, and turn off the fourth switch; and in a sensing phase, the timing signal circuit is configured to turn off the first switch, turn off the second switch, turn on the third switch, and turn on the fourth switch.

19. The sense amplifier of claim 13, wherein:
the third switch comprises a fifth transistor having a gate coupled to the timing signal circuit; and
the fourth switch comprises a sixth transistor having a gate coupled to the timing signal circuit.

20. The regeneration circuit of claim 19, wherein:
one of a source and a drain of the fifth transistor is coupled to a drain of the third transistor, and the other one of the source and the drain of the fifth transistor is coupled to the output of the first inverting circuit; and
one of a source and a drain of the sixth transistor is coupled to a drain of the fourth transistor, and the other one of the source and the drain of the sixth transistor is coupled to the output of the second inverting circuit.

21. A method of operating a regeneration circuit of a sense amplifier, wherein the regeneration circuit includes a first inverting circuit having an input and an output, a second inverting circuit having an input and an output, a first transistor coupled to the input of the second inverting circuit, and a second transistor coupled to the input of the first inverting circuit, the method comprising:
driving a gate of the first transistor with a first input signal;
driving a gate of the second transistor with a second input signal;
in a reset phase,
decoupling the output of the first inverting circuit from the first transistor and the input of second inverting circuit; and
decoupling the output of the second inverting circuit from the second transistor and the input of first inverting circuit; and
in a sensing phase,
coupling the output of the first inverting circuit to the first transistor and the input of the second inverting circuit; and
coupling the output of the second inverting circuit to the second transistor and the input of the first inverting circuit;
wherein, in the reset phase, the first input signal is above a threshold voltage of the first transistor, and the second input signal is above a threshold voltage of the second transistor; and
in the sensing phase, the first input signal falls at a first rate, the second input signal falls at a second rate, and the first rate and the second rate are different.

22. The method of claim 21, wherein:
in the sensing phase, the first input signal is above the threshold voltage of the first transistor, and the second input signal is above the threshold voltage of the second transistor.

23. The method of claim 21, further comprising:
transitioning from the sensing phase to a decision phase when the first input signal falls below the threshold voltage of the first transistor or the second input signal falls below the threshold voltage of the second transistor.

24. The method of claim 23, further comprising:
in the decision phase, resolving a bit value based on the first input signal and the second input signal.

25. The method of claim 21, wherein the regeneration circuit includes a first switch coupled between the output of the first inverting circuit and the first transistor, and a second switch coupled between the output of the second inverting circuit and the second transistor, and wherein:
decoupling the output of the first inverting circuit from the first transistor comprises turning off the first switch;
decoupling the output of the second inverting circuit from the second transistor comprises turning off the second switch;
coupling the output of the first inverting circuit to the first transistor comprises turning on the first switch; and
coupling the output of the second inverting circuit to the second transistor comprises turning on the second switch.

26. A method of operating a regeneration circuit of a sense amplifier, wherein the regeneration circuit includes a first inverting circuit having an input and an output, a second inverting circuit having an input and an output, a first transistor, and a second transistor, wherein a drain of the first transistor is directly coupled to the input of the second inverting circuit, and a drain of the second transistor is directly coupled to the input of the first inverting circuit, the method comprising:
driving a gate of the first transistor with a first input signal;
driving a gate of the second transistor with a second input signal;
in a reset phase,
decoupling the output of the first inverting circuit from the first transistor; and
decoupling the output of the second inverting circuit from the second transistor; and
in a sensing phase,
coupling the output of the first inverting circuit to the first transistor; and
coupling the output of the second inverting circuit to the second transistor;
wherein, in the reset phase, the first input signal is above a threshold voltage of the first transistor, and the second input signal is above a threshold voltage of the second transistor; and
in the sensing phase, the first input signal falls at a first rate, the second input signal falls at a second rate, and the first rate and the second rate are different.

27. The method of claim 26, wherein:
decoupling the output of the first inverting circuit from the first transistor comprises decoupling the output of the first inverting circuit from the drain of the first transistor;
decoupling the output of the second inverting circuit from the second transistor comprises decoupling the output of the second inverting circuit from the drain of the second transistor;
coupling the output of the first inverting circuit to the first transistor comprises coupling the output of the first inverting circuit to the drain of the first transistor; and
coupling the output of the second inverting circuit to the second transistor comprises coupling the output of the second inverting circuit to the drain of the second transistor.

28. The method of claim 27, wherein the regeneration circuit includes a first switch coupled between the output of the first inverting circuit and the drain of the first transistor, and a second switch coupled between the output of the second inverting circuit and the drain of the second transistor, and wherein:
decoupling the output of the first inverting circuit from the drain of the first transistor comprises turning off the first switch;
decoupling the output of the second inverting circuit from the drain of the second transistor comprises turning off the second switch;
coupling the output of the first inverting circuit to the drain of the first transistor comprises turning on the first switch; and
coupling the output of the second inverting circuit to the drain of the second transistor comprises turning on the second switch.

* * * * *

UNITED STATES PATENT AND TRADEMARK OFFICE
CERTIFICATE OF CORRECTION

PATENT NO. : 11,374,560 B1
APPLICATION NO. : 17/321005
DATED : June 28, 2022
INVENTOR(S) : Todd Morgan Rasmus It is certified that error appears in the above-identified patent and that said Letters Patent is hereby corrected as shown below:

In the Claims

Claim 20: the preamble should be corrected to "The sense amplifier" instead of "The regeneration circuit".

Signed and Sealed this
Nineteenth Day of December, 2023

Katherine Kelly Vidal
Director of the United States Patent and Trademark Office